United States Patent
Dunsky et al.

(10) Patent No.: US 6,784,399 B2
(45) Date of Patent: Aug. 31, 2004

(54) MICROMACHINING WITH HIGH-ENERGY, INTRA-CAVITY Q-SWITCHED $CO_2$ LASER PULSES

(75) Inventors: Corey M. Dunsky, Los Gatos, CA (US); Hisashi Matsumoto, Hillsboro, OR (US); Richard S. Harris, Portland, OR (US); John T. Kennedy, Granby, CT (US); Vernon A. Seguin, Windsor, CT (US); Leon Newman, Glastonbury, CT (US)

(73) Assignees: Electro Scientific Industries, Inc., Portland, OR (US); Coherent, Inc., Santa Clara, CA (US)

(*) Notice: Subject to any disclaimer, the term of this patent is extended or adjusted under 35 U.S.C. 154(b) by 82 days.

(21) Appl. No.: 10/143,040

(22) Filed: May 9, 2002

(65) Prior Publication Data

US 2002/0185474 A1 Dec. 12, 2002

Related U.S. Application Data

(60) Provisional application No. 60/289,908, filed on May 9, 2001.

(51) Int. Cl.[7] .............................................. B23K 26/38
(52) U.S. Cl. .............................. 219/121.68; 219/121.69
(58) Field of Search ........................ 219/121.6, 121.61, 219/121.62, 121.67, 121.68, 121.69, 121.72, 121.83, 121.85

(56) References Cited

U.S. PATENT DOCUMENTS

| | | | |
|---|---|---|---|
| 3,772,611 A | 11/1973 | Smith | 331/94.5 |
| 4,030,839 A | 6/1977 | Rickert | 356/251 |
| 4,169,251 A | 9/1979 | Laakmann | 331/94.5 |
| 4,363,126 A | 12/1982 | Chenausky et al. | 372/38 |
| 4,438,514 A | 3/1984 | Chenausky et al. | 372/64 |
| 4,719,639 A | 1/1988 | Tulip | 372/66 |
| 4,787,090 A | 11/1988 | Newman et al. | 372/82 |
| 4,789,770 A | 12/1988 | Kasner et al. | 219/121.7 |
| 4,815,094 A | 3/1989 | Cantoni | 372/93 |

(List continued on next page.)

FOREIGN PATENT DOCUMENTS

| | | | |
|---|---|---|---|
| DE | 19719700 | 12/1998 | H05K/3/00 |
| JP | 11-145581 | 5/1999 | H05K/3/00 |
| WO | WO 98/40939 | 9/1998 | H01S/3/0975 |
| WO | WO 02/082596 | 10/2002 | H01S/3/00 |

OTHER PUBLICATIONS

"Review CW High Power CO2 Lasers", Anthony J. DeMaria, Proceeding of the IEEE, vol. 61, pp. 731–745 (1973).

(List continued on next page.)

Primary Examiner—Samuel M. Heinrich
(74) Attorney, Agent, or Firm—Stoel Rives LLP

(57) ABSTRACT

An EOM Q-switched $CO_2$ laser produces bursts of laser pulses delivered at a high PRF such as 20–140 kHz and having a short high-power spike of about 80–150 ns followed by a lower-power tail of about 0.05–12.0 $\mu s$. The bursts and/or laser pulses can be shaped by controlling the RF pumping duty cycle, the delay between the onset of RF pumping and the initiation of Q-switching, the pulse repetition frequency, and/or the duration of the tail. The bursts of laser pulses can be adapted to facilitate machining of metal layers and/or layers containing materials having disparate vaporization temperatures and/or disparate melting points, such as FR4 or green ceramics.

110 Claims, 13 Drawing Sheets

U.S. PATENT DOCUMENTS

| | | | |
|---|---|---|---|
| 4,858,240 A | 8/1989 | Pöhler et al. | 372/10 |
| 4,891,819 A | 1/1990 | Sutter, Jr. et al. | 372/82 |
| 4,930,901 A | 6/1990 | Johnson et al. | 372/26 |
| 5,177,748 A | 1/1993 | Zhang | 372/18 |
| 5,220,576 A | 6/1993 | Krueger et al. | 372/87 |
| 5,299,223 A | 3/1994 | Van der Wal | 372/94 |
| 5,353,297 A | 10/1994 | Koop et al. | 372/64 |
| 5,491,579 A | 2/1996 | Justus et al. | 359/241 |
| 5,593,606 A | 1/1997 | Owen et al. | 219/121.71 |
| 5,600,668 A | 2/1997 | Erichsen et al. | 372/87 |
| 5,610,936 A | 3/1997 | Cantoni | 372/93 |
| 5,654,782 A | 8/1997 | Morokawa et al. | 349/143 |
| 5,680,412 A | 10/1997 | DeMaria et al. | 372/92 |
| 5,748,663 A | 5/1998 | Chenausky | 372/64 |
| 5,751,585 A | 5/1998 | Cutler et al. | 364/474.03 |
| 5,841,099 A | 11/1998 | Owen et al. | 219/121.69 |
| 5,844,200 A | 12/1998 | Leader et al. | 219/121.71 |
| 5,847,960 A | 12/1998 | Cutler et al. | 364/474.29 |
| 5,848,091 A * | 12/1998 | Mombo Caristan | 372/103 |
| 5,854,805 A | 12/1998 | Reid et al. | 372/70 |
| 5,864,430 A | 1/1999 | Dickey et al. | 359/559 |
| 5,881,087 A | 3/1999 | Sukhman et al. | 372/61 |
| 6,211,485 B1 | 4/2001 | Burgess | 219/121.7 |
| 2002/0033387 A1 | 3/2002 | Kurosawa et al. | 219/121.72 |
| 2002/0040893 A1 | 4/2002 | Arai et al. | 219/121.72 |
| 2002/0125227 A1 | 9/2002 | Sun et al. | 219/121.61 |

OTHER PUBLICATIONS

"Power Sealing of Laser Area Transverse RF Discharge CO2 Lasers", Abramski, et al., Applied Physics Letter, vol. 54, pp. 1833–1835 (1989).

BeO Capillary CO2 Waveguide Laser, Bukhardt, et al., Optics Communications, vol. 6, pp. 193–195 (Oct. 1972).

"Hollow Metallic and Dielectric Wave-guides for Long Distance Optical Transmission and Lasers", Marcatilli, et al., Bell System Technical Journal, vol. 43, pp. 1783–1809 (1964).

"Lasers", Anthony E. Siegman, University Science books, pp. 712–727 (1788).

"Reflection Polarizers for the vacuum ultraviolet using A1+MgF2 mirrors and an MgF2 plate", Hass, et al., Applied Optics, vol. 17, Jan. 1, 1978.

"Polarization Studies in the vacuum Ultraviolet", Hamm, et al. Journal of the Optical Society of America, vol. 55, No. 11, pp 1460–1463 (1965).

"Reflective device for polarization rotation", Greninger, Applied Optics, vol. 27, No. 4, pp 774–776 (1988).

"Radiofrequency–Discharge–Excited CO2 Lasers", Hall, et al. pp. 165–258.

* cited by examiner

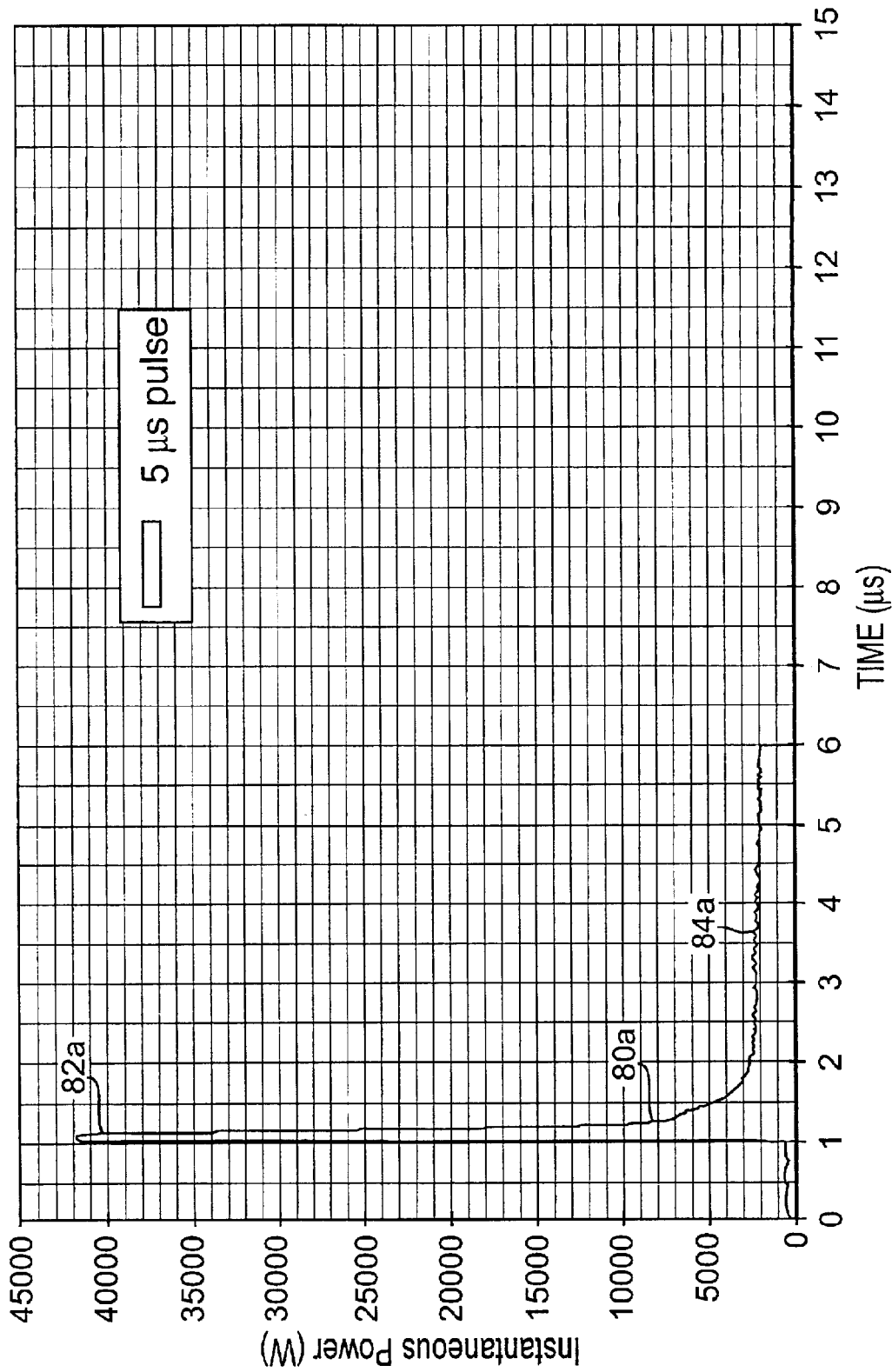

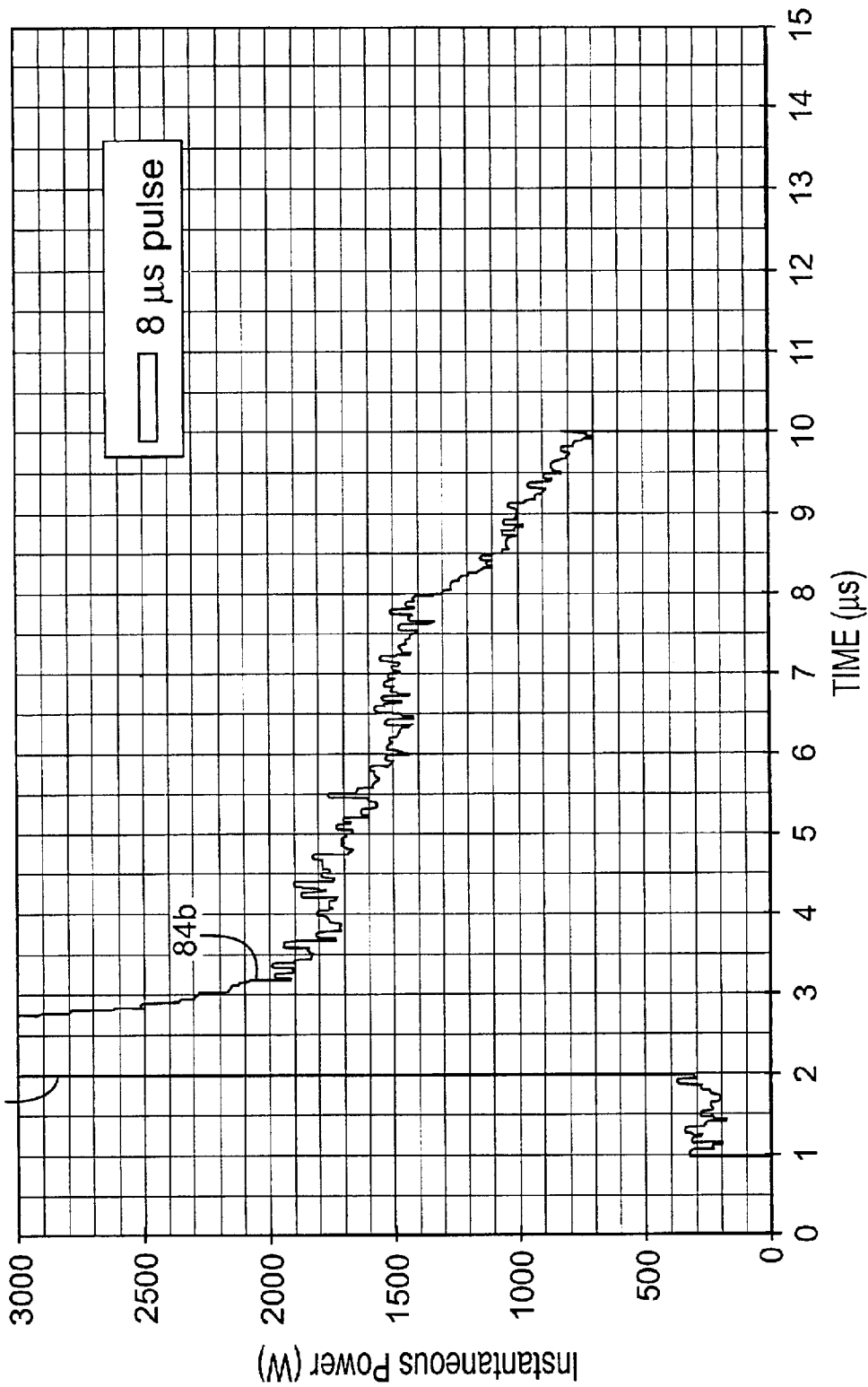

MICROMACHINING WITH HIGH-ENERGY, INTRA-CAVITY Q-SWITCHED CO₂ LASER PULSES

RELATED APPLICATION

This patent application derives priority from U.S. Provisional Application No. 60/289,908, filed May 9, 2001 and is a continuation-in-part of U.S. patent application Ser. No. 10/116,360, filed Apr. 4, 2002, which derives priority from U.S. Provisional Application No. 60/281,431, filed Apr. 4, 2001.

FEDERALLY SPONSORED RESEARCH OR DEVELOPMENT

Not Applicable.

COPYRIGHT NOTICE

© 2002 Electro Scientific Industries, Inc. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR §1.71(d).

TECHNICAL FIELD

The invention relates to laser micromachining and, in particular, to micromachining layered or multimaterial substrates or devices, such as reinforced or unreinforced epoxy resin, FR4 or green ceramic, with a Q-switched $CO_2$ laser.

BACKGROUND OF THE INVENTION

Q-switched solid-state lasers are well known and have been demonstrated successfully for many laser micromachining applications. However, micromachining parameters for Q-switched lasers, including their wavelengths (ranging from near infrared to deep ultraviolet), pulsewidths, pulse energies, and pulse repetition rates, have still not been perfected for certain classes of layered organic, inorganic, and metallic microelectronic material constructions with respect to throughput and machining quality, such as cleanness, side wall taper, roundness, and repeatability.

One such class of materials, commonly used in the printed wiring board (PWB) industry, includes glass cloth impregnated with one or more organic polymer resins that is sandwiched between conductive metal layers, typically copper. This material configuration is known as "FR4 ."

Another class, commonly used as packaging materials for high-performance integrated circuits, includes unfired, "green" ceramic materials. These ceramic substrates are formed by high-pressure pressing of powders of common ceramics such as aluminum oxide ($Al_2O_3$) or aluminum nitride (AlN). The micron-($\mu$m) or submicron-scale particles are held together with organic "binders" that provide sufficient mechanical integrity for machining operations such as via drilling to be carried out. Afterward, the green material is fired at high temperature, driving off the binders and fusing or sintering the microparticles together into an extremely strong, durable, high-temperature substrate.

U.S. Pat. Nos. 5,593,606 and 5,841,099 of Owen et al. describe techniques and advantages for employing Q-switched UV laser systems to generate laser output pulses within advantageous parameters to form through-hole or blind vias through at least two different types of layers in multilayer devices, including FR4. These patents discuss these devices and the lasers and parameters for machining them. These parameters generally include nonexcimer output pulses having temporal pulse widths of shorter than 100 nanoseconds (ns), spot areas with spot diameters of less than 100 $\mu$m, and average intensities or irradiances of greater than 100 milliwatts (mW) over the spot areas at repetition rates of greater than 200 hertz (Hz).

$CO_2$ lasers have also been employed for drilling microvias in multilayered materials, including FR4. Because the 9- to 11-$\mu$m wavelength of all $CO_2$ lasers is highly reflected by metals such as copper, it is very difficult to use $CO_2$ lasers to drill substrates that feature overlying metallic layers. Consequently, $CO_2$ lasers are preferably applied to layered substrates with either no overlying copper or an overlying copper layer in which via openings have been previously etched by standard chemical means. Such "pre-etched" or "conformal mask" multilayered substrates also typically have no woven reinforcements such as glass fibers in the dielectric layers and are commonly produced in the printed wiring board industry for compatibility with $CO_2$ laser microvia-drilling operations. Common $CO_2$ microvia-drilling lasers include RF-excited lasers, transversely excited atmospheric (TEA) lasers, and fast-axial-flow lasers.

RF-excited $CO_2$ lasers are the most common type of $CO_2$ laser employed for microvia-drilling applications. These lasers employ a radio-frequency (RF) electrical discharge to provide the excitation or "pump" energy that causes stimulated emission from the $CO_2$ molecules. The $CO_2$ molecules, mixed with other gases, are sealed in a tube at pressures well below atmospheric (typically less than 100 torr), and the RF discharge is typically applied across electrodes oriented perpendicularly to the axis of the laser cavity. RF-excited $CO_2$ lasers produce pulses with relatively long pulsewidths, such as 3–50 microseconds ($\mu$s), at moderate pulse repetition rates or pulse repetition frequencies (PRFs), such as 2–10 kHz with pulse energies in the 1- to 30-millijoule (mJ) range. The instantaneous power levels of these lasers are low to moderate, typically 1 kW or below, although leading-edge designs are approaching 2 kW.

TEA $CO_2$ lasers employ higher gas pressure (near or above atmospheric) and a DC electrical pump discharge that, as in RF-excited lasers, is applied across electrodes oriented transversely to the laser cavity axis. The main advantage of the TEA $CO_2$ laser design is the short pulsewidth spike and the corresponding high instantaneous power that these lasers can generate. The high power is produced in a 100- to 150-ns spike followed by a low-power "tail" lasting up to several microseconds. Pulse energies in the hundreds of millijoules are typical. This combination of pulse energy and pulse spike duration results in extremely high peak instantaneous power, on the order of megawatts. However, because the laser beams exhibit many spatial transverse electromagnetic "modes," TEA lasers are not highly focusable like the other types of $CO_2$ lasers, so much of the available pulse energy is either masked in the beam-delivery system or by the substrate itself, or both. Nevertheless, TEA lasers can produce vias of excellent quality in FR4. Such vias exhibit glass fiber ends that are cleanly vaporized and flush with the via wall, and little or no over-etching of the surrounding polymer resin. Despite the advantages in via quality, TEA $CO_2$ lasers suffer from the disadvantage of operating at low PRFs, typically 0.2–0.5 kHz. As a result, drilling speed and throughput are limited.

Fast-axial-flow $CO_2$ lasers have seen less application in commercial microvia-drilling applications. Unlike the RF-excited and TEA designs, the tube containing the $CO_2$ gas mixture is not sealed. Rather, the gas mixture flows rapidly through the tube, along the laser cavity axis. Although the gas is collected and recirculated, the need for an external gas reservoir is disadvantageous. Pumping excitation is accomplished by either DC or RF discharge and is usually longitudinal for DC discharge and transverse for RF excitation. A high flow speed is needed to avoid significant heat buildup in the gas while in the discharge region, so this design requires additional gas-pumping equipment that is not needed in the sealed-tube designs.

Despite the added complexity, fast-axial-flow $CO_2$ lasers have become the most common industrial $CO_2$ laser design for applications that require high average power (0.5–10 kW), such as metal cutting or welding. Application to via drilling is limited by the large size and complexity of the laser. Most via-drilling work with these lasers has been aimed toward utilizing the high average power that they generate and obtaining short pulses, such as 1–10 μs, at moderate PRFs through the use of an external modulation device such as a shutter.

For both RF-excited and fast-axial-flow $CO_2$ lasers, the external modulator is required to obtain short pulsewidths (less than several hundred microseconds) needed for microvia-drilling operations. In the externally modulated configuration, the instantaneous power of these lasers is equal to their average power, which is relatively low.

On the other hand, Q-switched $CO_2$ lasers have been used for some time in military imaging radars but have not been applied to material processing until recently. In "A High-Power Q-switched $CO_2$ Laser and Its Application to Organic Materials Processing," Proceedings of the International Congress on Applications of Lasers and Electro-Optics, Sakai, T., Imai, H., and Minamida, K. (1998), the authors report using a $CO_2$ laser design that employed a high-speed rotating chopper wheel to provide intracavity modulation. The basic resonator consisted of a fast-axial-flow RF-excited cavity capable of 2 kW continuous-wave (CW) output in $TEM_{01}$ mode, which is not highly focusable. The eight sections comprising the discharge region of this laser are quite large, producing a beam 18 mm in diameter. The RF power supply, capable of continuous pumping at 15 kW power level, is also quite large.

Sakai et al. used this laser to ablate films of polyethylene terephthalate (PET) and polypropylene (PP) and found ablation quality similar to that achieved with a TEA laser. The article concludes that "[a] Q-switched $CO_2$ laser will be an attractive tool for the industrial applications of polymer ablation such as the paint stripping or machining of the microelectronics device."

SUMMARY OF THE INVENTION

An object of the present invention is, therefore, to provide a high-pulse-energy, Q-switched $CO_2$ laser and/or method for micromachining microelectronics manufacturing materials.

A process of particular interest is the drilling of small holes or microvias in multilayered, laminated substrates such as those used in high-density printed wiring boards and integrated circuit (IC) chip packages. FR4, for example, may be difficult to laser-machine for several reasons. First, the material is highly heterogeneous, particularly with respect to properties governing laser ablation characteristics such as melting and vaporization temperatures. Specifically, the melting and vaporization temperatures of the woven glass reinforcement and the polymer resin matrix differ greatly. Pure silicon dioxide ($SiO_2$) has melting and vaporization temperatures of 1,970 Kelvin (K) and 2,503 K, respectively, while typical organic resins such as epoxies vaporize at much lower temperatures, on the order of 500–700K. This disparity makes it difficult to laser-ablate the glass component while avoiding ablation of too much of the resin surrounding individual glass fibers or in regions directly adjacent to fiber bundles.

Second, most FR4 glass cloth is woven from bundles or "yarns" of individual glass filaments. Filaments are typically 4 to 7 μm in diameter, and yarns range from about 50 μm to several hundred microns in diameter. The yarns are generally woven in an open-weave pattern, resulting in areas of high glass density where yarns cross each other and areas of low or zero glass density, such as between adjacent bundles. Because the locations of vias cannot be selected a priori with respect to the weave pattern, the desirable via locations will vary in glass density. Thus laser micromachining process parameters that work equally well in both high- and low-glass-density regions of the substrate are desirable. Process conditions that are "aggressive" enough to cleanly vaporize all the glass in high-density regions and at the same time are "mild" enough to avoid over-etching or removing too much resin in low-density regions have been difficult to achieve with existing $CO_2$ laser systems.

Laser-machining green ceramics poses concerns similar to those for processing FR4 due to the differences in the thermal properties of the organic binders and the ceramic microparticles. The disparity between the vaporization temperature of the binder (again, on the order of 500 K) and the ceramic (3,800 K for $Al_2O_3$) influences the way material is removed during laser drilling. Because ceramic has a high vaporization temperature, it is quite difficult to remove green ceramic through direct melting (at 2,340 K for $Al_2O_3$) or vaporization of the microparticles.

The preferred laser micromachining process instead relies upon the explosive vaporization of the binder material holding the micro-particles together. When exposed to laser pulses, the binder vaporizes much more easily than the ceramic, and the organic vapor is driven to high temperature at extremely high heating rates, creating localized high-pressure gas regions in the spaces between microparticles. The high-pressure gas then expands rapidly, disintegrating the green material. Thus the green ceramic material can be removed while in its solid state with each laser pulse, at removal rates much higher than could be obtained by its direct vaporization.

Material removal by explosive vaporization of the binder can be either advantageous or disadvantageous in laser-micromachining green ceramics. If the organic vapor pressure is too high or spread across too wide an area, undesirable effects such as chipping or microcracking can occur. If the high-pressure regions are too localized or not hot enough, poor material-removal rates are achieved.

In a preferred embodiment of the Q-switched $CO_2$ laser employed in the present invention, an SPL-100-HE laser produces pulses sharing some of the characteristics of the TEA $CO_2$ laser but is capable of delivering the pulses at much higher PRFs, such as 20–140 kHz. The laser output features a short high-power spike of about 80–150 ns, followed by a lower-power tail, the duration of which is adjustable between about 0.05 and 12.0 μs. Pulse energies ranging from less than 1 mJ to greater than 20 mJ can be attained by varying the duration of the tail. Peak instantaneous power in the spike can be as high as, or higher than, 40–50 kW; while in the tail, the instantaneous power decreases slowly from about 1–2 kW to less than 1 kW over about 5–10 μs.

The laser output characteristics provide unique combinations of laser wavelength, pulse energy, pulse peak power, PRF, and pulsewidth (pulse duration) that are not available in any conventional laser micromachining system. The combination of high peak power, high pulse energy, very high PRF, and variable pulsewidth permits a great deal of flexibility in the manner in which laser energy is deposited in the target material and permits the target material to be removed with a degree of precision or "cleanness" and at high speeds previously unattainable with conventional $CO_2$ laser systems.

Due to the unique combination of pulse output characteristics generated by the high-energy Q-switched $CO_2$ laser and the flexibility in tuning individual pulses, this laser is advantageous for solving the problem of drilling microvias in difficult substrates such as FR4 or green ceramics. The heating rates of the organic binder, interstitial pressures, and the duration of each high-pressure event can be controlled by pulsewidth and the rates of energy deposition into, and heat transfer from, the substrate material. The instantaneous power delivered to the substrate throughout the laser pulse or from pulse to pulse in a multipulse burst can be used to govern these effects. Because this laser's pulses may be tuned for pulsewidth, peak instantaneous power attained during each pulse, and total pulse energy, the Q-switched laser's output characteristics offer a high degree of control of energy deposition and material-removal processes. This versatility offers the potential for optimizing both micromachining quality (elimination of undesirable effects such as chipping or cracking) and drilling speed.

Other laser micromachining processes in which the speed of material removal and quality (precision) of micromachining are both important may also benefit.

Additional objects and advantages of this invention will be apparent from the following detailed description of preferred embodiments thereof, which proceeds with reference to the accompanying drawings.

BRIEF DESCRIPTION OF THE DRAWINGS

FIGS. 2A, 2B, and 2C are graphs of instantaneous power versus time characteristics of three exemplary laser pulses, having different respective pulsewidths, obtained from the laser system employed in the present invention.

FIGS. 3A, 3B, and 3C are expanded graphs of instantaneous power versus time, showing details of the pulse tails of the laser pulses shown in FIGS. 2A, 2B, and 2C, respectively.

DETAILED DESCRIPTION OF PREFERRED EMBODIMENTS

Figure 1:
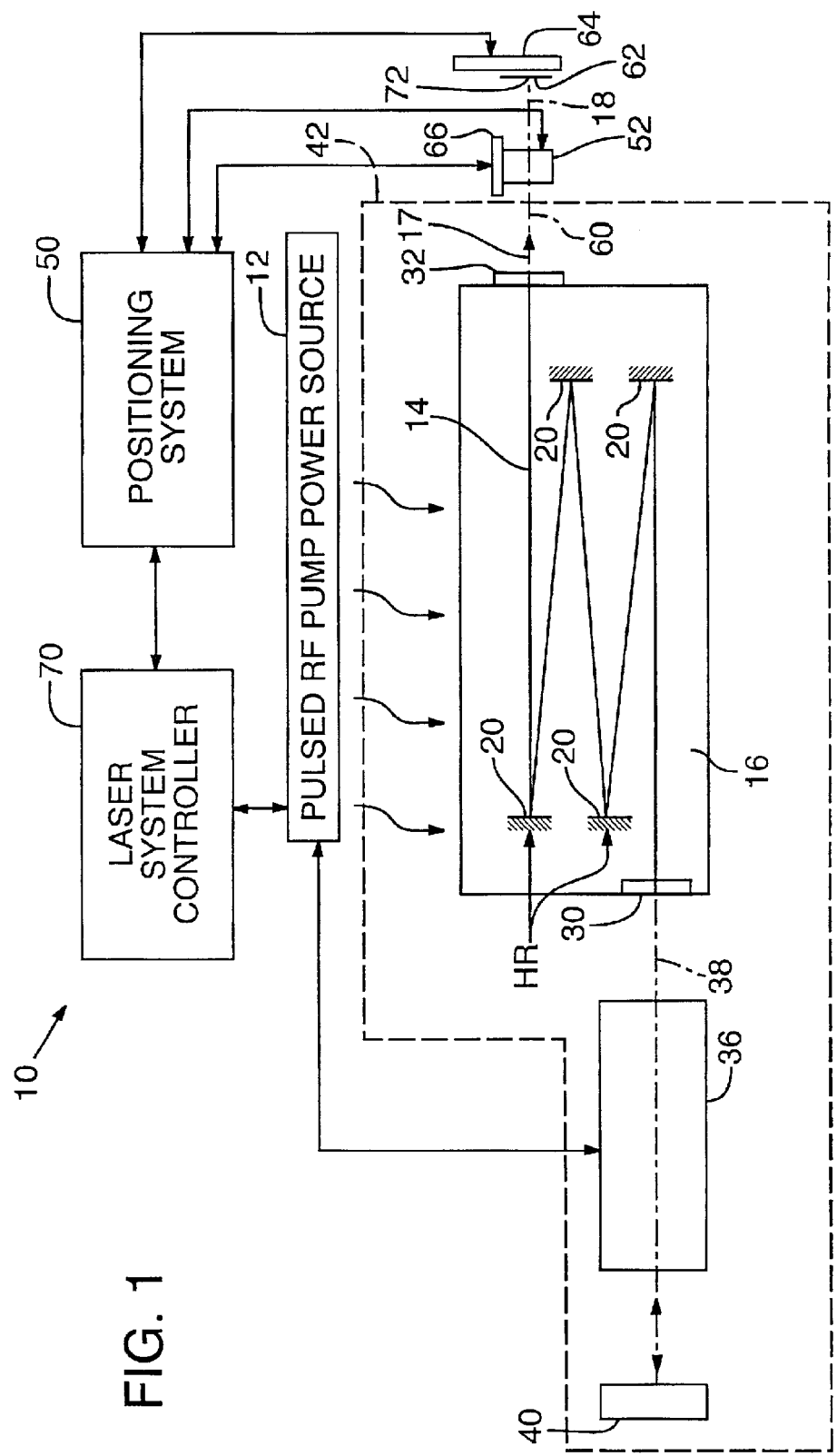
FIG. 1 is a simplified schematic view of an embodiment of a preferred laser system of the present invention that includes a multiply folded waveguide gain cell in a resonator cavity.

With reference to FIG. 1, a Q-switched $CO_2$ laser system 10 of the present invention is pumped by a pulsed RF power or pumping source 12 such as those used for some conventional $CO_2$ laser microvia-drilling systems. However, instead of using a conventional tube with a wide cross-sectional dimension for holding the $CO_2$ gas mixture of the laser medium, laser system 10 confines the lasing medium in a narrow waveguide channel 14 in a gain cell 16. U.S. Pat. No. 4,787,090 of Newman et al. describes an exemplary $CO_2$ waveguide laser. The laser employed in laser system 10 is presented herein only by way of example to an SPL-100-HE laser. The SPL-100-HE laser, the GEM-100-HE laser, the GEM 3000 QS laser, and the Q 3000 laser, sold by Coherent/DEOS are currently the preferred embodiments, but other intracavity modulated $CO_2$ lasers could be employed.

Waveguide channel 14 constrains the number of modes propagated and imparts excellent spatial mode quality to a gain cell output 17, permitting it to be formed into a highly focusable beam of laser system output 18. The cross-sectional dimensions of the waveguide channel 14 are preferably on the order of several millimeters, such as 1–7 mm, and its cross-sectional shape is preferably square or rectangular with sharp or rounded corners, but other shapes are acceptable. To increase the gain volume (the volume of gas in which lasing action occurs), the waveguide channel 14 is made quite long, preferably on the order of a meter or more in length, and folded to maintain compactness, with high-reflector surfaces 20 at each vertex. The waveguide channel 14 shown in FIG. 1 has five folds or legs, but skilled persons will appreciate that numerous configurations are possible.

The waveguide channel 14 is packaged with RF electrodes and conduction (diffusion) cooling features, and a high-transmission sealing window 30 and a partially transmissive output coupler 32 are situated at opposite ends of waveguide channel 14. These features form a compact, sealed, highly efficient gain cell 16. When fitted with a high-reflector end rather than the transmissive window 30, the gain cell 16 can be operated independently as a continuous-wave RF-excited $CO_2$ laser emitting up to or even greater than about 40–50 W at about a 9.2- to 9.6-μm wavelength, preferably at about a 9.2-μm to 9.4-μm wavelength, and more preferably at about a 9.25-μm wavelength. This 9.2- to 9.6-μm wavelength range, although not as powerful as some spectral lines of the typical $CO_2$ 9–11 μm range, such as the 10.6-μm wavelength, is known to be more advantageous for micromachining the polymer materials commonly used in microelectronics substrates. Skilled persons will appreciate that unsealed or nonwaveguide gain cells 16 could also be employed.

An electro-optic modulator (EOM) module 36 is positioned outside the gain cell 16 along an optical axis 38 between window 30 and a high-reflector element, also located outside gain cell 16, that forms a "rear mirror" 40 of the Q-switched resonator cavity 42. The EOM 36 primarily includes an electro-optic crystal transparent to far-infrared $CO_2$ laser radiation. Typically, when, in response to a switching signal, a high voltage (on the order of 2 kV) is applied to the crystal of EOM 36, the voltage produces a quarter-wave retardation that transforms the linearly polarized radiation emerging from the window 30 of the gain cell 16 into circular polarization. The circularly polarized radiation then impinges upon rear mirror 40, and the reflected radiation, which is circularly polarized in the opposite direction as the incident radiation, is passed by the EOM 36 to propagate in the forward direction (toward the gain cell 16) as radiation linearly polarized at 90 degrees phase retardation relative to the linearly polarized radiation emerging from the window 30. Along with a polarizing element on the window 30, EOM 36 acts to block forward propagation of the radiation. EOM 36 is thereby effectively "closed," and this blockage spoils the gain in the resonator cavity 42. When the switching signal is changed and the high voltage is rapidly removed from the EOM 36, EOM 36 is effectively "open," and optical gain quickly builds up within the resonator cavity 42 formed by the rear mirror 40 and the output coupler 32. A Q-switched pulse is generated, and laser output 18 propagates through the output coupler 32.

A beam positioning system 50 may direct laser output 18 with a variety of beam-manipulating components such as lens components, beam-directing reflectors (such as Z, Y, and X positioning mirrors), and/or a fast positioner 52 (such as a pair of galvanometer mirrors), positioned along a beam path 60 to a desired laser target area or position 72 on a workpiece 62. Beam-manipulating components preferably include optical elements and an aperture mask placed at or near the beam waist created by the optical elements to block any undesirable side lobes and peripheral portions of the beam so that a precisely shaped spot profile is subsequently transferred to the work surface. In a preferred embodiment, the optical elements include a focusing lens and/or a collimating lens pair to add flexibility to the configuration of laser system 10.

Varying the size of the aperture can control the edge sharpness of the spot profile to produce a smaller, sharper-edged intensity profile that should enhance the alignment accuracy or affect the depth or diameter of the ablation pattern. In addition, with this arrangement, the shape of the aperture can be precisely circular or also be changed to rectangular, elliptical, or other noncircular shapes. The aperture of the mask may optionally be flared outwardly at its light exiting side and could be used without the optical elements. Multiple aperture masks can be placed on a wheel to facilitate quick and automated control of spot size.

The optical elements may alternatively or additionally include one or more beam-shaping components that convert laser pulses 80 (FIG. 2) into shaped (and focused) pulses that have a near-uniform "top hat" spatial profile. Such beam shaping components may include aspheric optics or diffractive optics. In a preferred embodiment, the optical components include imaging optics useful for controlling beam size and divergence. Skilled persons will also appreciate that shaped laser output can be employed without using an aperture mask.

In one embodiment, the beam-shaping components include a diffractive optic element (DOE) that can perform complex beam shaping with high efficiency and accuracy. Although a single element DOE is preferred, skilled persons will appreciate that the DOE may include multiple separate elements such as the phase plate and transform elements disclosed in U.S. Pat. No. 5,864,430 of Dickey et al., which also discloses techniques for designing DOEs for the purpose of beam shaping. The shaping and imaging techniques discussed above are described in detail in International Publication No. WO 00/73013 and in corresponding U.S. patent application Ser. No. 09/580,396 of Dunsky et al.

Different combinations of the optical components can be positioned on removable and interchangeable Image Optics Modules (IOM) or Rails (IOR) such as those described in the aforementioned patent application of Dunsky et al.

Beam positioning system 50 preferably employs a split-axis system wherein a Y stage 64, typically moved by linear motors, supports and moves workpiece 62; an X stage 66 supports and moves fast positioner 52 and other beam-manipulating components; the Z dimension between the stages X and Y is adjustable; and the beam-directing reflectors align the beam path 60 through any turns between output coupler 32 and fast positioner 52. Beam positioning system 50 permits quick movement between target positions 72 on the same or different circuit boards or chip packages to effect unique or duplicative processing operations based, on provided test or design data. Skilled persons will also appreciate that a system with a single X-Y stage for workpiece positioning and a fixed beam position and/or stationary galvanometer for beam positioning may alternatively be employed.

A preferred beam positioning system 50 is described in detail in U.S. Pat. No. 5,751,585 of Cutler et al. and may include Abbe error-correction means described in U.S. patent appl. Ser. No. 09/755,950, filed Jan. 5, 2001, of Cutler and in International Publication No. WO 01/52004 A1, published on Jul. 19, 2001, and U.S. Publication No. 2001-0029674 A1, published on Oct. 18, 2001.

A laser system controller 70 preferably synchronizes the firing of resonator cavity 42 with the motion of stages 64 and 66 and fast positioner 52 in a manner well known to skilled practitioners. Laser system controller 70 is shown generically to control fast positioner 52, stages 64 and 66, and pulsed RF power source 12. Pulsed RF power source 12 preferably includes a microprocessor that controls the RF pumping pulses or pumping spans and the drive electronics of EOM 36. Skilled persons will appreciate that laser system controller 70 may include integrated or independent control subsystems to control and/or provide power to any or all of these laser components and that such subsystems may be remotely located with respect to laser system controller 70.

The EOM driver electronics and optical properties of the EOM 36 can be tailored in such a manner that the EOM 36 is open, Q-switching occurs, and optical gain is high when switching signal has an open state that applies high voltage to the crystal of EOM 36 and that the EOM 36 is closed, Q-switching does not occur, and optical gain is low when the switching signal has a closed state that removes the application of voltage to the crystal of EOM 36. This implementation has the advantage of not requiring the high voltage to be present whenever lasing is not desired, which is the majority of the time. This latter scheme is preferred for the laser system 10 of the present invention. The EOM 36 may be designed in accordance with the teachings of U.S. Pat. No. 5,680,412 of DeMaria et al.

The use of the EOM 36 as an intracavity modulator has several advantages for laser micromachining applications. Since EOM 36 is located inside the resonator cavity 42, EOM 36 functions as a true Q-switch, spoiling the gain in resonator cavity 42 until the EOM 36 is opened. This configuration facilitates generation of very short, high-peak-power laser pulses 80 of stimulated emission energy, having waveform characteristics that include a "gain spike" 82 of peak-instantaneous power and a "tail" 84 of a range of local maximum instantaneous powers such as those shown in the laser pulses 80 of FIG. 2. For example, the pulse 80 has a full-width-half-maximum (FWHM) duration of about 80 ns and peak instantaneous power on the order of tens of kilowatts, such as the laser pulses 80 shown in FIG. 2. The FWHM pulsewidth is governed by the kinetics of the gas mixture (and/or concentration of $CO_2$ gas) in the gain medium, which is generally determined during laser construction and is not controllably variable during conventional laser operation.

Because the electro-optic effect can be switched very rapidly in the crystal material of EOM 36 used in laser system 10, very high PRFs are achievable. Laser system 10 can generate Q-switched laser pulses 80 at PRFs such as 20–150 kHz or higher, and more generally preferably greater than 100 kHz. This PRF capability lays the basis for extremely fast micromachining applications because the available $CO_2$ laser energy is utilized in the micromachining process much more effectively than it is in conventional $CO_2$ laser systems.

Figure 2B:
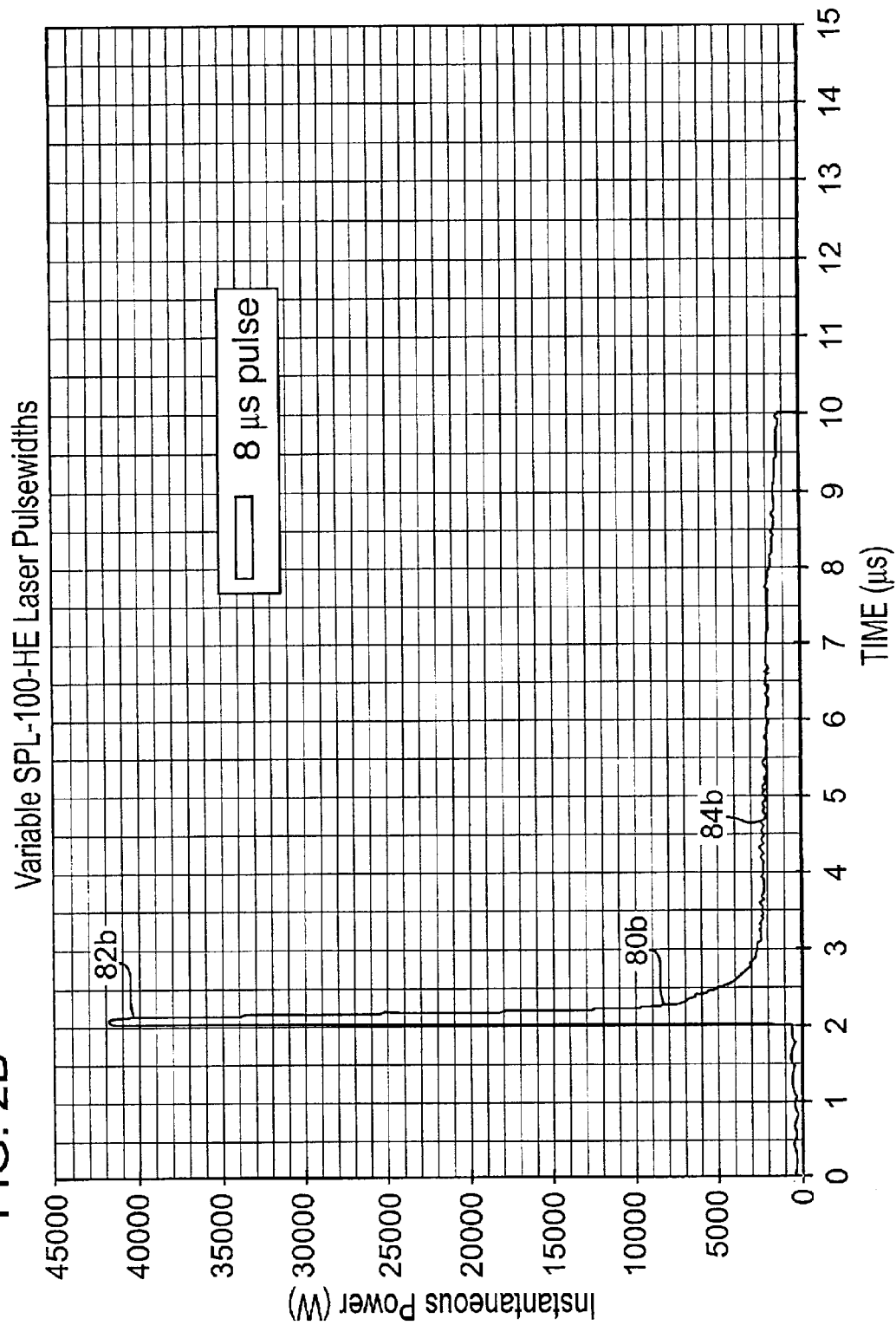
Figure 2C:
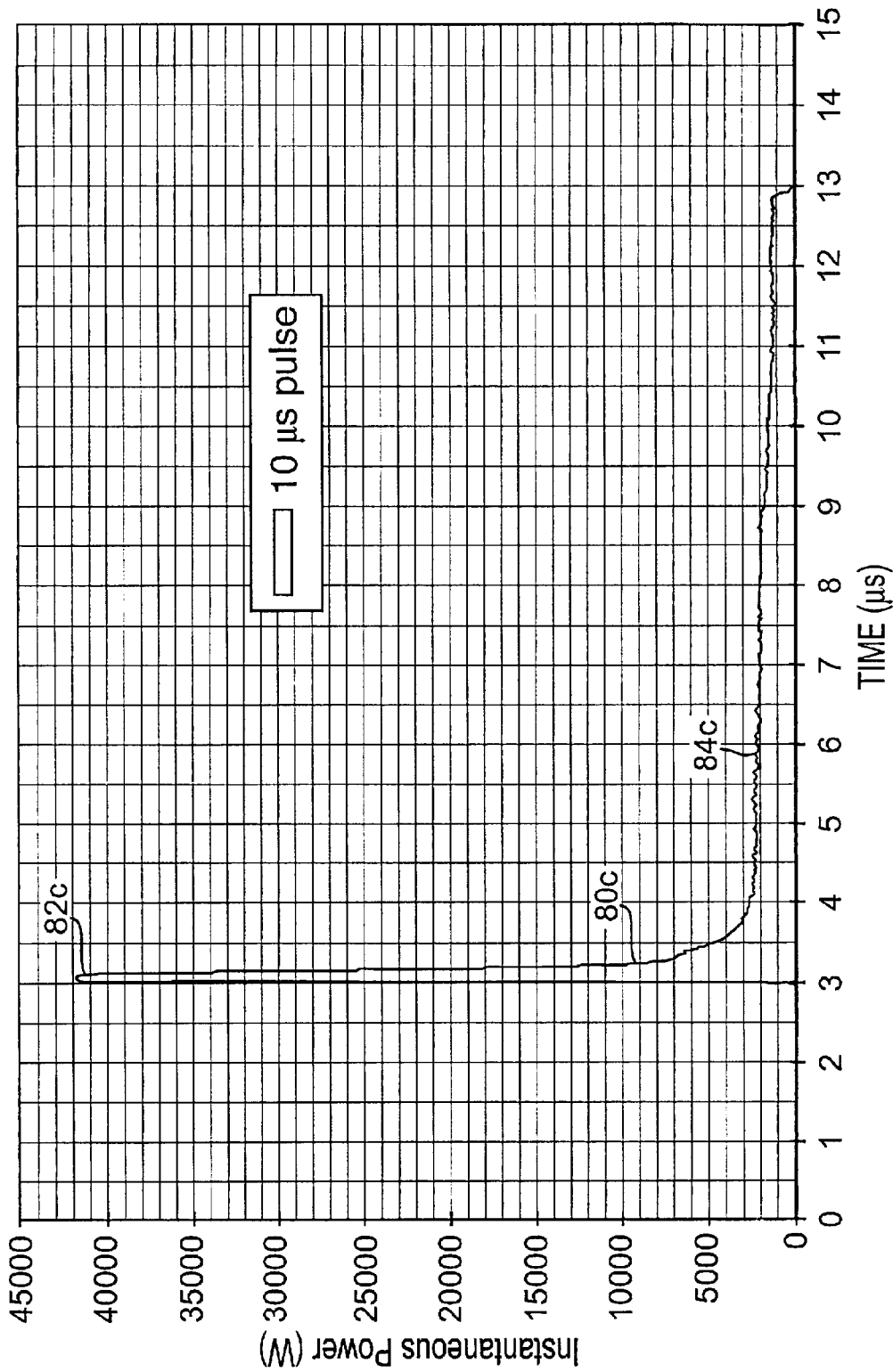

Once the Q-switched gain spike 82 has been generated, the laser system 10 continues to output laser energy during the "tail" 84 of the laser pulses 80. FIGS. 2A, 2B, and 2C (collectively FIG. 2) show respective pulse energies for laser pulses 80a, 80b, and 80c (collectively laser pulses 80) generated by an SPL-100-HE laser having respective durations or pulsewidths of 5, 8, and 10 $\mu$s and respective pulse energies of 13.5, 17.0, and 19.3 mJ under the same operating conditions. With reference to FIGS. 1 and 2, the durations of the tails 84a, 84b, and 84c (collectively tails 84) are controlled by the amount of time EOM 36 is open, such as by the timing of application of high voltage to the EOM 36. As long as the EOM 36 is open, the laser output 18 continues, albeit at much lower instantaneous power levels than those achieved in the gain spike 82. For convenience, the baseline-to-baseline pulsewidth, $\tau_{base}$, is denoted as the duration of the entire laser pulse 80, from initiation of the gain spike 82 through return to zero output as the voltage to the EOM 36 is switched off. An exemplary full $\tau_{base}$ range that can be generated from preferred embodiment of laser system 10 is from about 0.3 $\mu$s to about 12.0 $\mu$s. Skilled persons will appreciate, however, that other embodiments producing waveform characteristics exhibiting longer or shorter pulsewidths can be achieved with minor modifications to the driver electronics of the EOM 36.

Figure 3A:
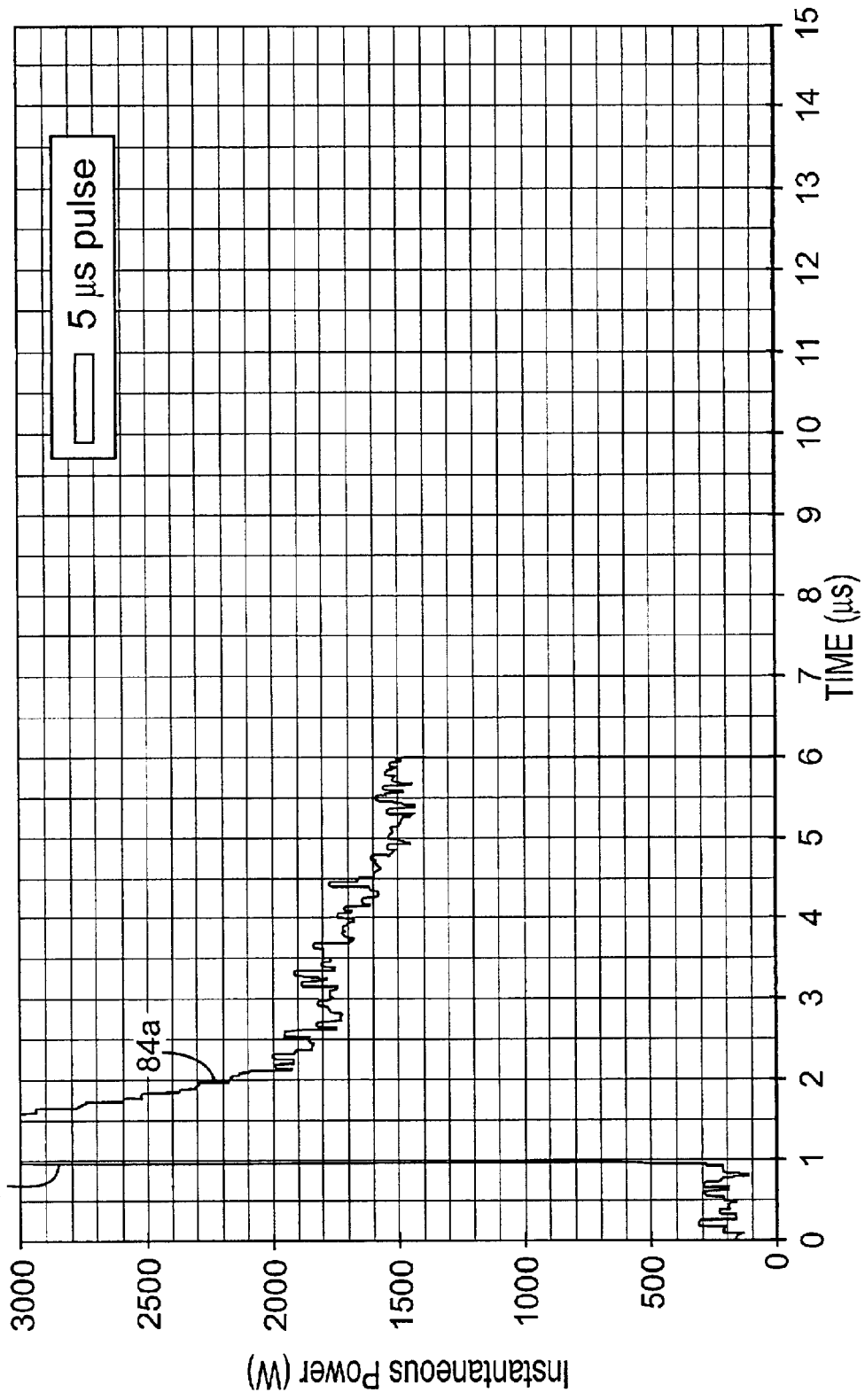
Figure 3C:
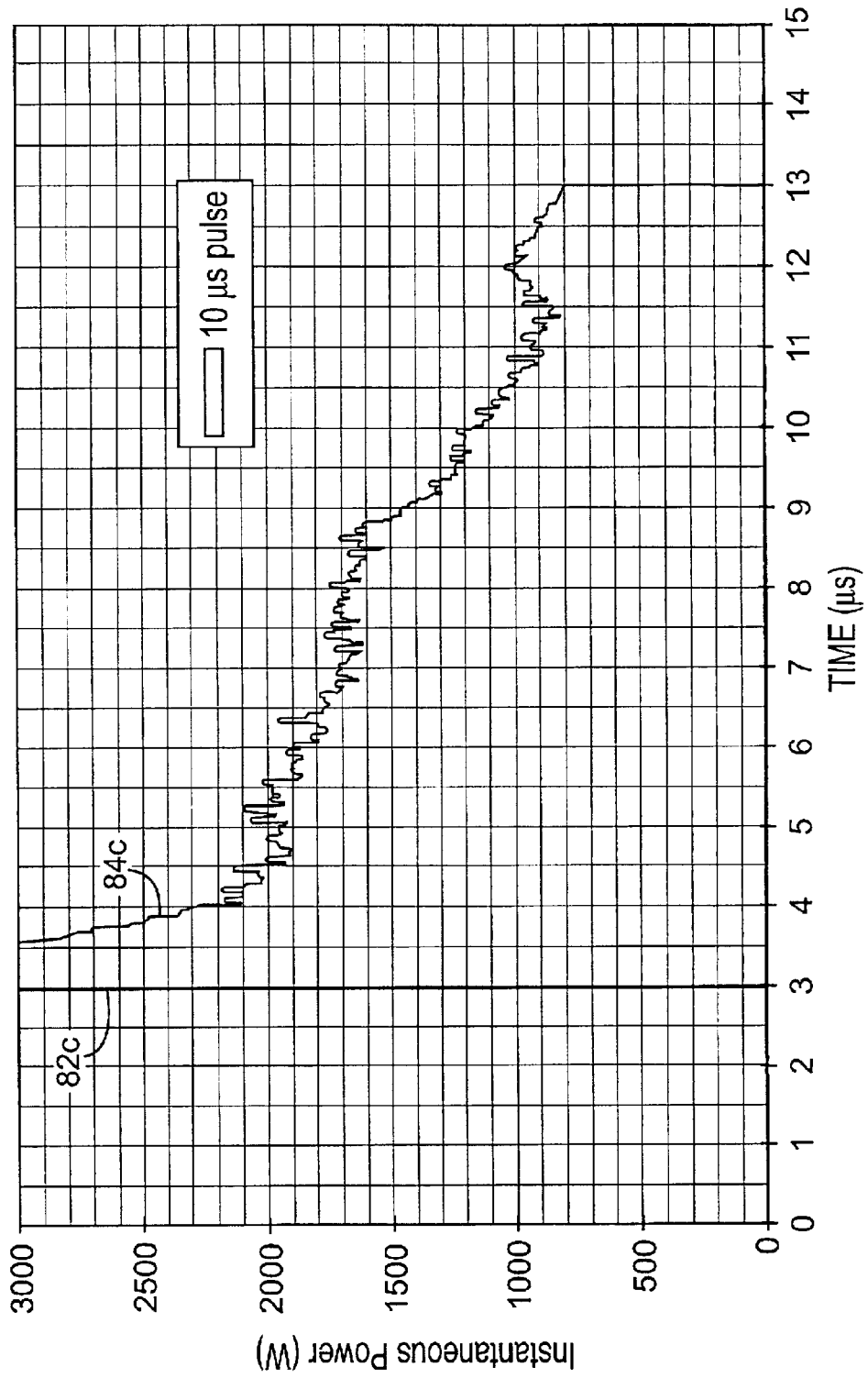

FIGS. 3A, 3B, and 3C (collectively FIG. 3) show the details of the tails 84a, 84b, and 84c of the laser pulses 80a, 80b, and 80c of FIGS. 2A, 2B, and 2C, respectively. About 1 $\mu$s after initiation of the gain spike 82, the local range of maximum instantaneous powers of the tail 84 settles at about 2 kW and thereafter gradually drops to about 1 kW over about 6 to 10 $\mu$s. These power levels in the tails 84 are significant for material removal, even in typically hard to process materials such as the glass reinforcing fibers in FR4, FR5, or chopped glass reinforced epoxy resin or materials containing aramid fibers, such as Kevlar™, or carbon fibers, such as in graphite epoxy. Because competing RF-excited $CO_2$ laser drilling systems that claim capability to drill FR4 operate throughout their entire pulse duration at instantaneous power levels of only about 1.0–1.2 kW, the higher or comparable power levels in the tails 84 of SPL-100-HE pulses will also be useful for removing FR4 material.

Another advantage of this invention is that the power level in the tails 84 can perform meaningful (controlled, precise) material removal. For difficult-to-ablate materials such as glass reinforcing fiber, the total energy delivered in each pulse must exceed some minimum value to cleanly remove the material of workpiece 62. Otherwise, the material fails to reach its vaporization temperature, and solid material or melted and re-solidified "slag" remains in the via hole or cut kerf. However, if the energy is delivered at a low rate (i.e., a low instantaneous power), any particular value of the pulse energy may not be sufficient to cleanly drill a microvia in workpiece 62. For example, an energy dose of 1 mJ delivered in repetitive 1-$\mu$s pulses (average instantaneous power of 1,000 W) may produce clean results, whereas the same 1 millijoule may not yield good results if delivered in 10-$\mu$s pulses (average instantaneous power of only 100 W). In the latter case, localized heat removal by conduction and radiation competes effectively with heat addition by absorption of the laser energy. The net result is that the material temperature does not climb high enough during the pulse to reach the value at which material is cleanly and rapidly removed from the hole as vapor, as melt expelled by expanding vapor, or both. In this case, even large amounts of energy (delivered in long pulses) will not produce clean drilling or material-removal results.

On the other hand, if the energy deposition in the material occurs rapidly enough, localized heat gain dominates heat-loss effects, rapidly raising the material temperature and producing clean material removal. Therefore, not only is it desirable to deliver a certain minimum energy dose in each laser pulse 80, but the energy should preferably also be delivered at a high enough rate for advantageous micromachining effects to occur. Thus, throughout each laser pulse 80, the instantaneous power (whether spike or tail) should preferably be higher than some threshold value, or poor via quality will occur. The threshold value is highly dependent on the substrate material being drilled and, to some extent, on the wavelength used to drill it. In the case of heterogeneous materials such as FR4, the threshold instantaneous power differs greatly between the glass fibers and the resin (e.g., epoxy) matrix, evidently due to the disparity in the vaporization temperatures that must be reached during the finite duration of the laser pulse 80 in order to cleanly expel the material.

A per-pulse energy dose of at least several millijoules delivered at a rate of at least 1 kW is desirable to cleanly ablate common dielectric materials used in microelectronics substrates. Hence, increasing the SPL-100-HE pulse energy by stretching out the duration of the tail 84 of the laser pulse 80 is a viable strategy for cleanly and rapidly drilling difficult-to-ablate materials of interest, including FR4 and particularly those materials with high vaporization temperatures and/or poor absorption of the incident laser radiation. The higher energy in the longer laser pulses 80 can do useful work because, as shown in FIG. 3, the instantaneous power remains above about 1 kW for all or most of the pulse duration.

In many cases, more energy is contained in the tails 84 of the SPL-100-HE laser pulses 80 than in the gain spikes 82. This differs from TEA $CO_2$ lasers, in which almost all of the energy is in the spike, the tail is low-power and undesirable, and the duration of the tail is governed by gas kinetics and is hence uncontrollable once the laser is constructed.

On the other hand, with respect to the laser system output 18 employed in the present invention, it is conceptually useful to liken the interaction between laser and material to heating a pot of water on the stove. The high-power Q-switched gain spike 82 rapidly brings the material to a boil (both figuratively and literally), and the pulse tail 84 keeps it simmering (vaporizing) at a reduced heat-input rate.

Although the EOM 36 of the SPL-100-HE laser may be triggered at high PRF, it is not currently practical to fire an arbitrarily long continuous burst of high-PRF laser pulses 80 to drill a via on a workpiece 62, because the RF pumping energy can overheat the gain cell 16 if the RF pumping energy is continuously applied to the gain cell 16. Due to the high-RF pumping power (at least 8 kW) preferred for implementing the present invention, the pumping energy is preferably modulated or applied in pumping pulses of short pumping spans or intervals, and then switched off to allowed the laser head to cool before RF power is reapplied. The modulated RF pumping scheme, designated as "superpulsing" or "superpumping," permits a higher pump power to be applied (for short pumping spans at a lower duty cycle) and therefore permits higher-energy Q-switched laser pulses 80 to be extracted from a gain cell 16 of a given design and size. Although the pumping levels are preferably set to be zero for OFF or a predetermined high level for ON, settings for intermediate ON levels may be employed to facilitate tunability of laser system output 18 in addition to the tunability techniques described below. For example, in certain instances where two RF bursts at the higher RF pumping level would be required to perform or complete a particular machining operation, an intermediate RF superpumping level (such as 4 W in the case of the SPL-100-HE) at a higher duty cycle may be employed to extend the gain curve (FIG. 7) to accommodate additional laser pulses 80 of useful energy to perform the operation in one burst to avoid the throughput detriment of waiting through an RF OFF span during the given operation. Skilled persons will appreciate that the RF pumping level may alternatively be controllably variable over a large range of pumping levels.

Figure 4:
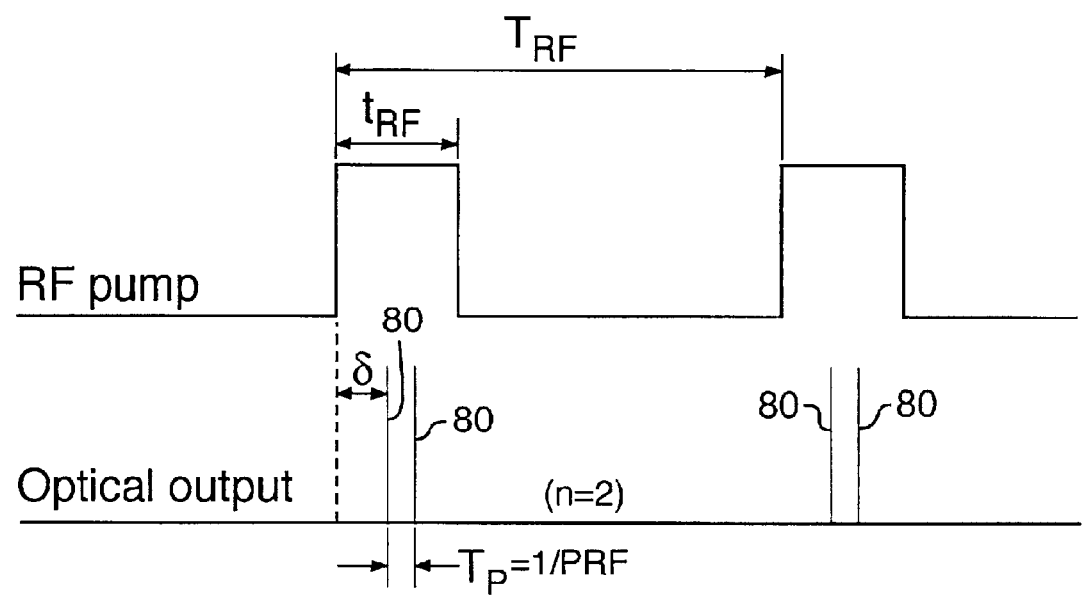
FIG. 4 is an exemplary timing diagram of various events during the generation of laser output.

FIG. 4 presents an exemplary timing diagram of the various events involved in the firing of a preferred embodiment of the laser system 10, employing an SPL-100-HE laser. For convenience, the laser pulses 80 in FIG. 4 are depicted as simple vertical lines and $\tau_{base}$ is not shown. With reference to FIG. 4, parameters for implementation of a preferred embodiment of laser system 10 to obtain preferred waveform characteristics include:

A pump cycle period, $T_{RF}$, of the RF pump cycle (combined RF ON and OFF times) of preferably about 0.5–3 ms, more preferably about 0.75–2 ms, and most preferably about 1.00 ms;

An RF pumping window or span, $t_{RF}$, which is the time the RF is ON, of preferably about 50–300 $\mu$s, more preferably about 50–250 $\mu$s, and most preferably about 75–125 $\mu$s, such as about 100 $\mu$s;

An RF duty cycle, DC, defined as $t_{RF}/T_{RF}$, of preferably less than 30%, more preferably less than 20%, and most preferably less than 12.5% for the SPL-100-HE at an 8 kW pumping power level;

A pulse number, n, in a set or burst of Q-switched laser pulses 80 generated during each RF pumping span or "burst," wherein the pulse number is preferably from 1–50, more preferably from 1–10, and most preferably from 2–8;

A burst number, m, of RF pumping spans or laser pulse bursts used to drill each via or material layer of via, wherein the burst number is preferably from 1–10, more preferably from 1–5, and most preferably from 1–2;

A PRF of Q-switched laser pulses 80, wherein the PRF is generally greater than 20 kHz, preferably greater than 75 kHz, more preferably greater than 100 kHz, and most preferably between about 100 kHz and 150 kHz or greater, and wherein the condition ($\tau_{base} \times$PRF)<1 is necessary to avoid pulse-to-pulse collisions; and A delay, $\delta$, between the onset of RF pumping and the switching of the first Q-switched laser pulse, 80, wherein the delay is preferably from 5–150 $\mu$s and more preferably from 10–100 $\mu$s such that $\delta < t_{RF}$, and wherein, by varying this delay, the profile of pulse energies and the amplitudes of the peak instantaneous powers in an n-pulse burst can be controlled and varied. Thus an amount of the delay that is shorter or longer than a nominal amount causes extraction of a time-shifted laser pulse 80 of stimulated emission energy of a lesser or greater peak instantaneous power than the nominal peak instantaneous power of a nominal laser pulse caused by the nominal amount of the delay. Where the nomimal delay falls on the gain curve associated with the cavity design determines whether the peak instantaneous power will be higher or lower than that of the nominal peak instantaneous power. If the nominal delay equals the delay associated with the highest obtainable peak instaneous power (with other parameters held constant), then any shift in delay to a longer or shorter value will cause the time-shifted laser pulse 80 to have a lesser peak instantaneous power. The effect of delay on peak instantaneous power with respect to position along the gain curve is described later in greater detail.

Skilled persons will appreciate that any combination within these exemplary parameters or even outside these exemplary parameters may be employed as desirable to accommodate a specific laser design and facilitate a specific laser and material interaction.

As an example, for exemplary values of $t_{RF}$ and $T_{RF}$ (100 and 1,000 $\mu$s, respectively), the laser system 10 may be run with PRF=100 kHz, $\tau_{base}$=1–5 $\mu$s, and $\delta$=30 $\mu$s. In this case, the interpulse period (1/PRF) is 10 $\mu$s and therefore as many as 8 optical pulses can fit inside each RF pumping span or burst. Thus 1<=n<=8 in this case. Applicants note that a $T_{RF}$ of about 1,100 $\mu$s is currently preferred so that the gas medium in gain cell 16 can cool during the entire average hole-to-hole move time associated with the preferred positioning system 50 in a via drilling operation on FR4. Skilled persons will appreciate that the $T_{RF}$ can be adjusted to utilize the entire target area to target area move time of a given position system and/or may be adjusted to be shorter when desirable to dwell over a single target area for application of multiple bursts.

In general, smaller values of n correspond to higher individual pulse energies, because all the energy transferred to the $CO_2$ molecules in each RF pumping span is distributed over fewer laser pulses 80. Pulse energies are also affected by the delay $\delta$. With reference again to FIG. 4, $\delta$ is used to tune the pulse-by-pulse profiles of peak power (pulse amplitude) and energy (pulse integral), described further below. For a single pulse per RF cycle (n=1), there is a value of $\delta$, denoted $\delta^*$, that yields maximum pulse energy. The pulse-energy values shown in FIG. 2 and discussed in the preceding text are for n=1 and $\delta=\delta^*$.

To extract the highest possible Q-switched pulse energies, the laser system 10 is run with n=1 and $\delta$ set to $\delta^*$. However, at this condition, the laser pulses 80 are repeated at the frequency of the RF pulses, $1/T_{RF}$, which is relatively low (e.g., 1 kHz in the example above). Generally, the laser RF pumping spans cannot be cycled faster than about 2.5 kHz due to gas-heating thermal effects; thus the highest individual pulse energy and the highest or maximum amplitude of peak instantaneous power is obtained by sacrificing processing speed.

An alternative to employing an RF burst containing a single laser pulse 80 is to generate bursts of multiple laser pulses 80 (i.e., n>1), in which each laser pulse 80 does not have the largest possible pulse energy for the selected pulsewidth $\tau_{base}$, but the total energy of the n-pulse burst can be greater and can be delivered very rapidly within a single RF pumping span, lasting for about 100 μs, for example.

If a single burst is sufficient to drill a via (i.e., m=1), then the drill time is equal to $t_{RF}$. If more than one burst is required (i.e., m>1) to obtain the desired via characteristics or other micromachining effects, then the drill time is equal to $T_{RF}*(m-1)+t_{RF}$. For exemplary time durations given above, a two-burst drill process would take 1.10 ms and a three-burst drill process would take 2.10 ms. If each burst has, for example, 3 to 8 pulses, then the two-burst process delivers 6 to 16 pulses per via, and so on. In comparison, for n=1, at the laser's maximum RF cycle frequency of 2.5 kHz, it would take at least 3.6 ms to deliver 10 pulses to the substrate material. This example illustrates the significant increase in speed that is possible with burst processing. This sacrifice in individual pulse energy for n>1 is a worthwhile compromise when drilling materials such as unreinforced organic resins or FR4. In a preferred embodiment, the RF OFF span is chosen to be equal to or slightly greater than the hole-to-hole move time of a given positioning system for a given laser operation employing few RF bursts per target, then the RF superpumping level and pumping span are optimized to suit throughput and process quality considerations. In a preferred embodiment, the RF superpumping level is maximized to the extent that the gain curve is not adversely shortened and permits an adequate number of useful laser pulses 80 to be extracted during the RF pumping span. Skilled persons will appreciate that it may be desirable to keep the RF power cycling at a constant frequency and power level during long moves when no laser pulses 80 are extracted.

Figure 5:
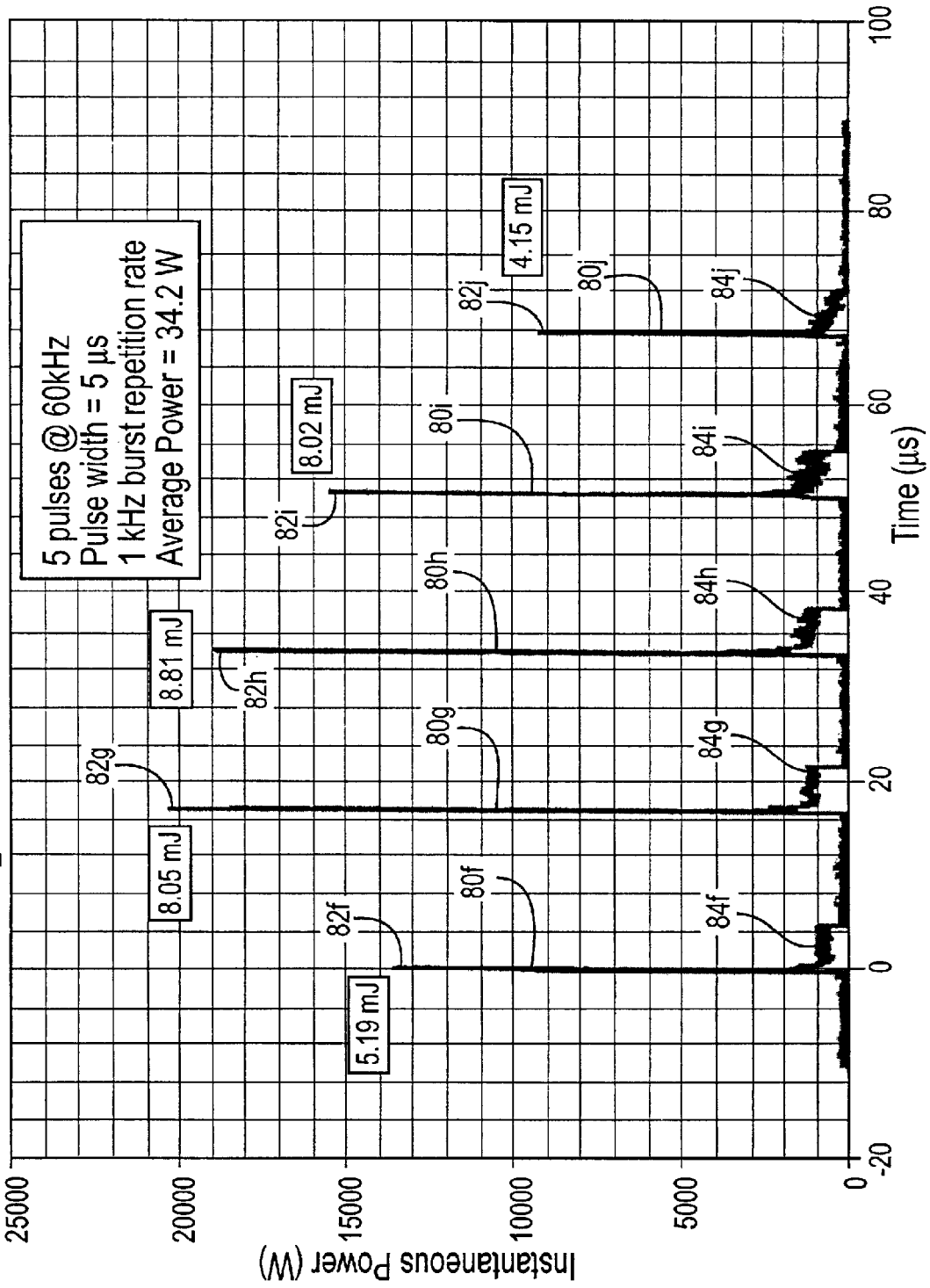
FIG. 5 is a graph of instantaneous power versus time for an embodiment of a laser output including a multipulse burst in accordance with the present invention.
Figure 6:
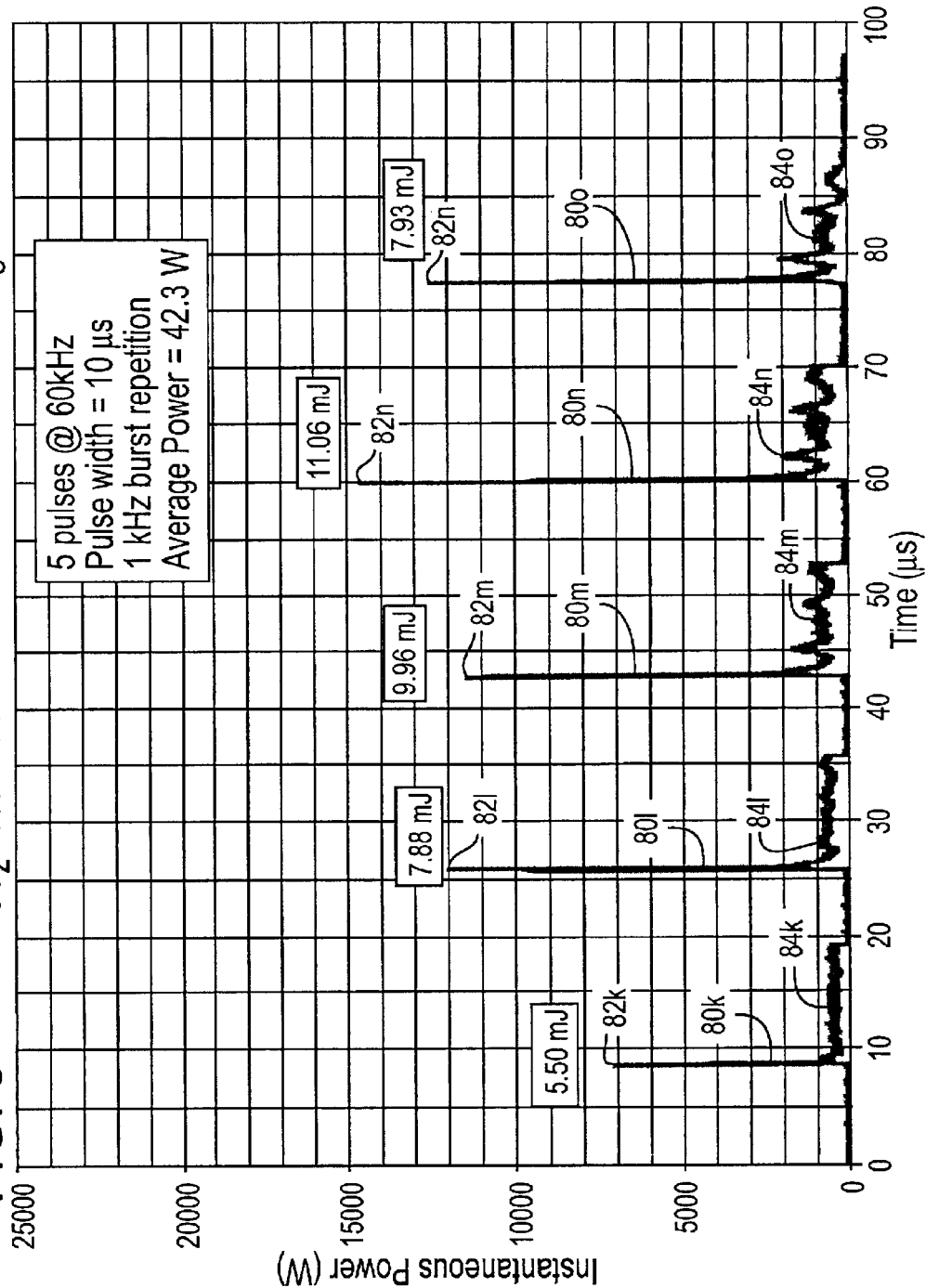
FIG. 6 is a graph of instantaneous power versus time for another embodiment of a laser output including a multipulse burst in accordance with the present invention.
Figure 7:
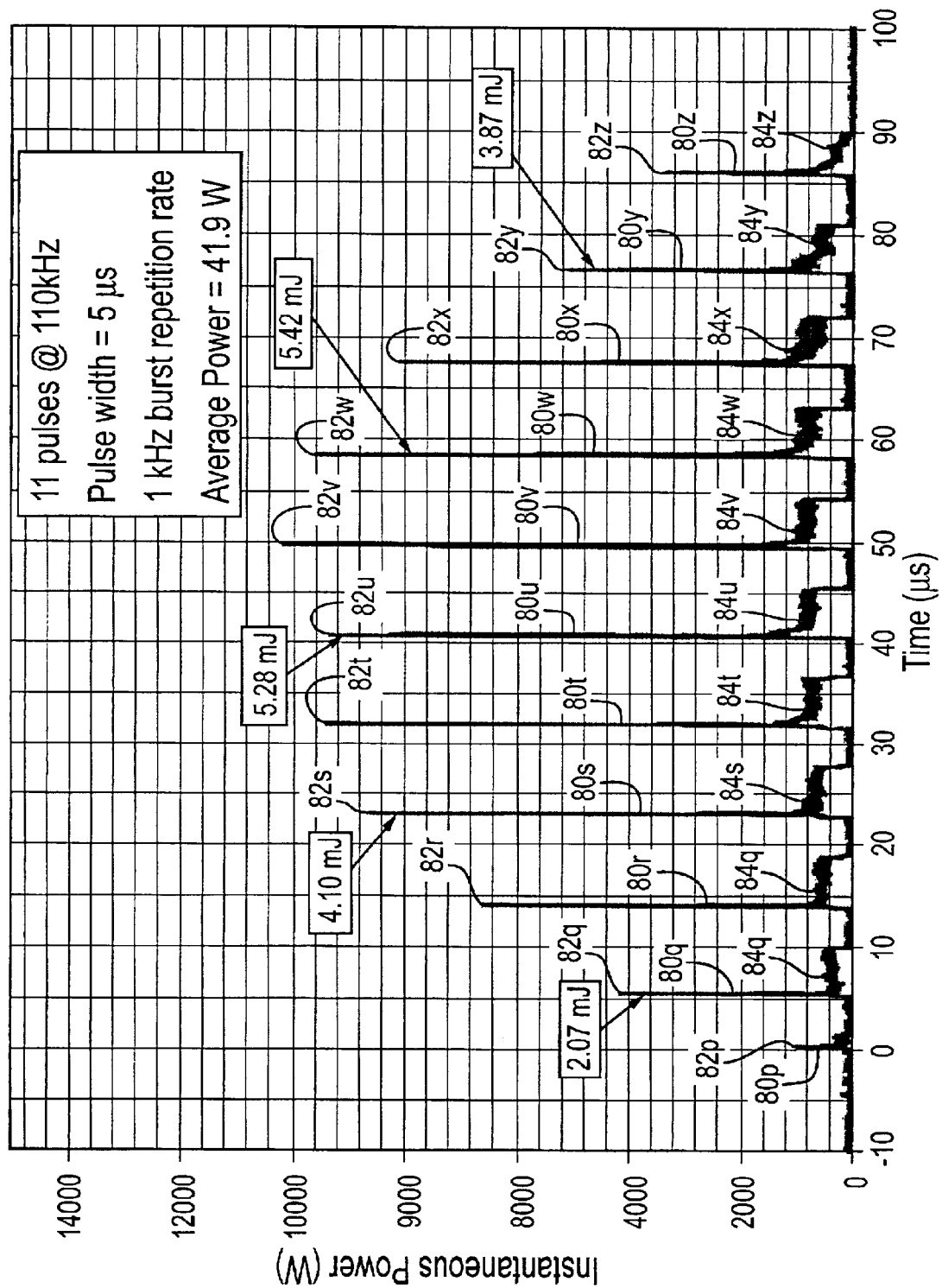
FIG. 7 is a graph of instantaneous power versus time for a further embodiment of a laser output including a multipulse burst in accordance with the present invention.

FIGS. 5–7 show exemplary cases of bursts of multiple laser pulses 80 in which δ is set to δ*. The parameter δ plays a role in the energies of bursts of multiple laser pulses 80 (n>1), as well as in the energies of bursts having a single laser pulse 80 (n=1). For n>1, there is also an optimal value of δ, again called δ*, that yields the maximum total energy of the aggregate of n pulses. These figures also demonstrate the effects of parameters $\tau_{base}$ and n on individual pulse waveform characteristics such as energies and peak instantaneous power levels, as well as the effect on aggregate energy of the n-pulse bursts.

FIG. 5 depicts an RF pumping span of 90 μs, in which a burst of five laser pulses 80f–80j, each having a $\tau_{base}$ pulsewidth of 5.0 μs, at a PRF of 60 kHz is initiated after a delay of 25 μs. The bursts of RF pumping energy were delivered at a burst repetition rate of 1 kHz. The aggregate energy delivered in the burst is 34.2 mJ, and individual pulse energies for laser pulses 80f–80j are 5.19 mJ, 8.05 mJ, 8.81 mJ, 8.02 mJ, and 4.15 mJ, respectively. The pulse energies and instantaneous peak power levels are well below those of the burst containing the single pulse 80a of 5 μs shown in FIG. 2. This example illustrates the differences between the single and multiple pulse bursts previously discussed.

FIG. 6 depicts an RF pumping span of 90 μs, in which a burst of five laser pulses 80k–80o, each having a $\tau_{base}$ pulsewidth of 10.0 μs, at a PRF of 60 kHz is initiated after a delay of 20 μs. The bursts of RF pumping energy were delivered at a burst repetition rate of 1 kHz. The aggregate energy delivered in the burst is 42.3 mJ, and individual pulse energies for laser pulses 80k–80o are 5.50 mJ, 7.88 mJ, 9.96 mJ, 11.06 mJ, and 7.93 mJ, respectively. With reference to FIGS. 5 and 6, although the individual pulse energies are larger in the longer $\tau_{base}$=10 μs laser pulses 80k–80o of FIG. 6, the instantaneous peak powers achieved in laser pulses 80k–80o of FIG. 6 are lower than those of the $\tau_{base}$=5 μs laser pulses 80f–80j of FIG. 5 under nearly the same given conditions (except for a small difference in the delay). This comparison shows that adjusting the $\tau_{base}$ allows a shift in the distribution of pulse energy between the gain spikes 82 and tails 84 of each laser pulse 80. The longer laser pulses 80k–80o contain less energy in the gain spikes 82k–82o and substantially more energy in the tails 84k–84o. On the other hand, shotening the tails 84 permits the $CO_2$ gain medium more time to re-charge between laser pulses 80, yielding higher instantaneous peak power in the gain spikes 82. This type of fine-tuning of the waveform characteristics including the total pulse energy and the comparative energies between gain spikes 82 and tails 84, facilitated by varying the $\tau_{base}$ in accordance with the present invention, is significantly advantageous for controlling the quality of micromachining processes such as via drilling and more specifically for controlling material-removal mechanisms in difficult materials such as FR4 or green ceramics.

FIG. 7 depicts an RF pumping span of 100 μs, in which a burst of 11 pulses 80p–80z, each having a $\tau_{base}$ pulsewidth of 5.0 μs, at a PRF of 110 kHz is initiated after a delay of 10 μs. The bursts of RF pumping energy were delivered at a burst repetition rate of 1 kHz. The aggregate energy delivered in the burst is 41.9 mJ, and individual pulse energies for laser pulses 80p–80z are approximately 0.5 mJ, 2.07 mJ, 3.24 mJ, 4.10 mJ, 4.80 mJ, 5.28 mJ, 5.60 mJ, 5.42 mJ, 4.94 mJ, 3.87 mJ, and 2.22 mJ, respectively. With reference to FIGS. 6 and 7, as the number of laser pulses 80 in each burst increases, the individual pulse energies and instantaneous peak power levels of each laser pulse 80 decrease, even though the aggregate energy delivered in the burst increases. Thus the number of laser pulses 80 delivered in each burst can be tailored to accommodate specific laser and material interactions, such as those that favor fewer laser pulses 80 of higher energy and instantaneous peak power or those that favor more laser pulses 80 of lower energy and instantaneous peak power.

With reference again to FIG. 7, the effect of the delay δ is discussed in greater detail. In FIG. 7, the 11 laser pulses 80p–80z display a range of amplitudes for peak instantaneous power, starting low, building to a maximum, and then decreasing toward the end of the RF pumping span $t_{RF}$. The amplitudes of the peaks of the gain spikes 82p–82z trace out a time-dependent "gain curve" which is a characteristic of the laser gain cell 16. Careful inspection of FIG. 7 reveals that the range of local maximum tail amplitudes of the instantaneous power of the tails 84p–84z of the laser pulses 80p–80z follows a similar pattern. The explanation for this gain curve has to do with the time dependence of the energy transfer processes occurring in the $CO_2$ gain medium of the gain cell 16.

After a short delay following the RF pumping start time, little energy has been transferred from the electrical excitation to the excited vibrational states (the "upper state level") of the $CO_2$ molecules. Hence, if a pulse extraction start time is requested after a short delay, little energy is available in the $CO_2$ lasing medium and the resulting laser pulse 80 has low amplitude and low energy. As the RF excitation proceeds through a delay of intermediate duration, the $CO_2$ laser medium becomes more fully excited, i.e., the upper-state energy level becomes more fully populated. Fully populating the upper-state energy level may, for example, take 30–60 μs, depending on gas mixture, pressure, and characteristics of gain cell 16. Hence, for a pulse extraction start time at an intermediate delay after the RF pumping start time, an optional maximum instantaneous power amplitude and pulse energy can be extracted in a Q-switched laser pulse 80. For a pulse extraction start time at a long delay after the RF pumping start time, the addition of still more RF pump energy begins to heat up the gas mixture in the gain cell 16, and the lower-state energy level in the lasing process becomes thermally populated. This population of the lower-state energy level decreases the gain achievable in the stimulated emission process, and the amplitude and energy of the Q-switched pulse 80 correspondingly decrease. These two time-dependent effects, often referred to as pumping time and gas heating effects, govern the pulse waveform characteristics throughout the RF pumping span.

The shape of the time-dependent gain curve can be utilized advantageously for micromachining processes through the parameter δ. For n=1, the maximum in the gain curve explains why an optimal value of δ exists for which maximum pulse energy is obtained. The delay δ can therefore be used to control a burst profile of the peak instantaneous powers and pulse energies of the multiple laser pulses 80 within each burst.

Figure 8:
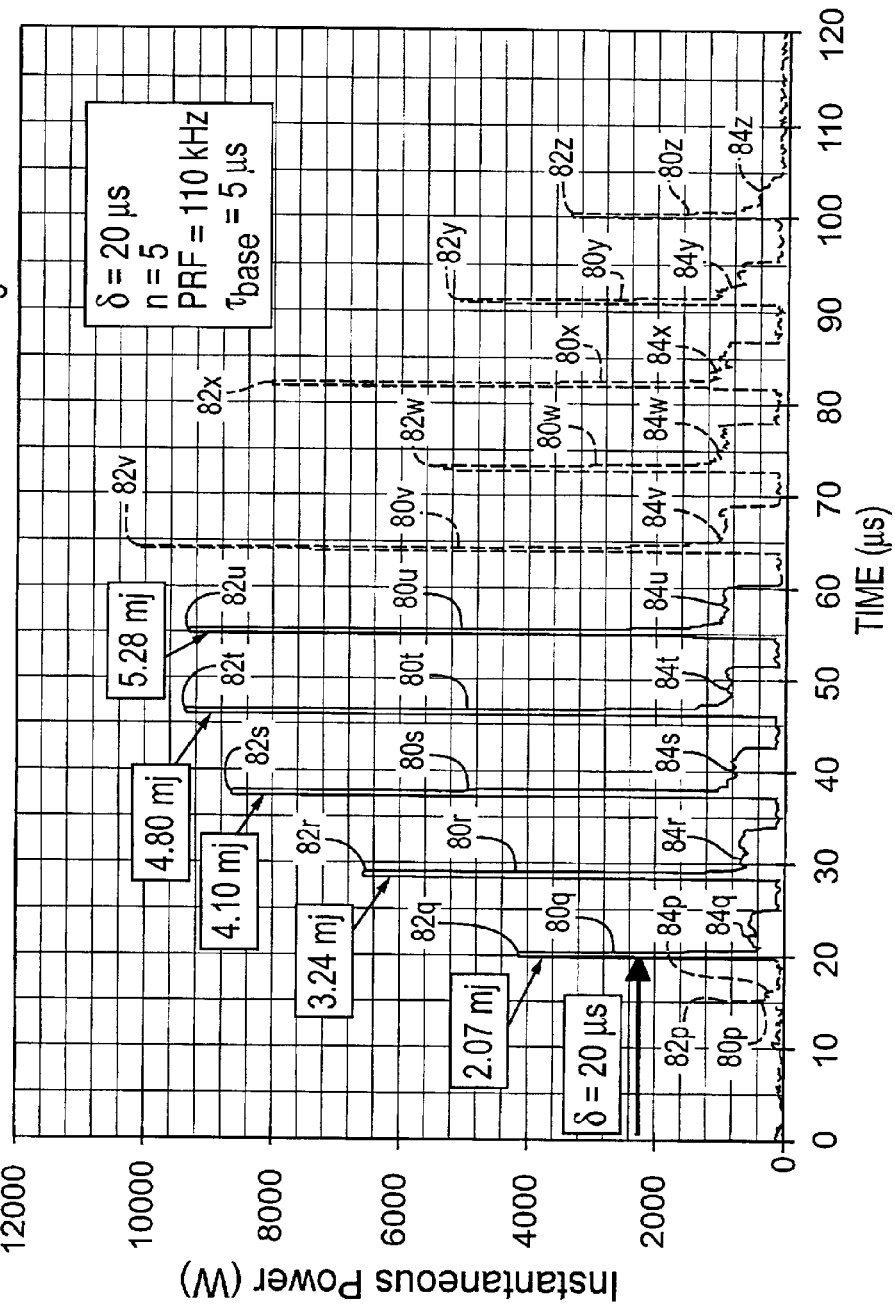
FIG. 8 is a graph of instantaneous power versus time for the laser output of FIG. 7, modified to emit successively increasing pulse energies.

For example, if a particular micromachining process or substrate material responds best when several laser pulses 80 of successively increasing energy are applied, then the delay δ and n would be set to relatively low values and the PRF would be set to a relatively high value to obtain a burst profile similar to that shown in FIG. 8. FIG. 8 shows an exemplary burst profile that employs only five laser pulses 80q–80u generated after 20-µs delay under the other given conditions concerning the laser pulses 80 in FIG. 7. The laser pulses 80p and 80v–80z are not generated, but are shown in phantom for convenience. Thus a desired "ascending" pulse-energy profile in the burst can be achieved by selecting appropriate values of n and δ.

Figure 9:
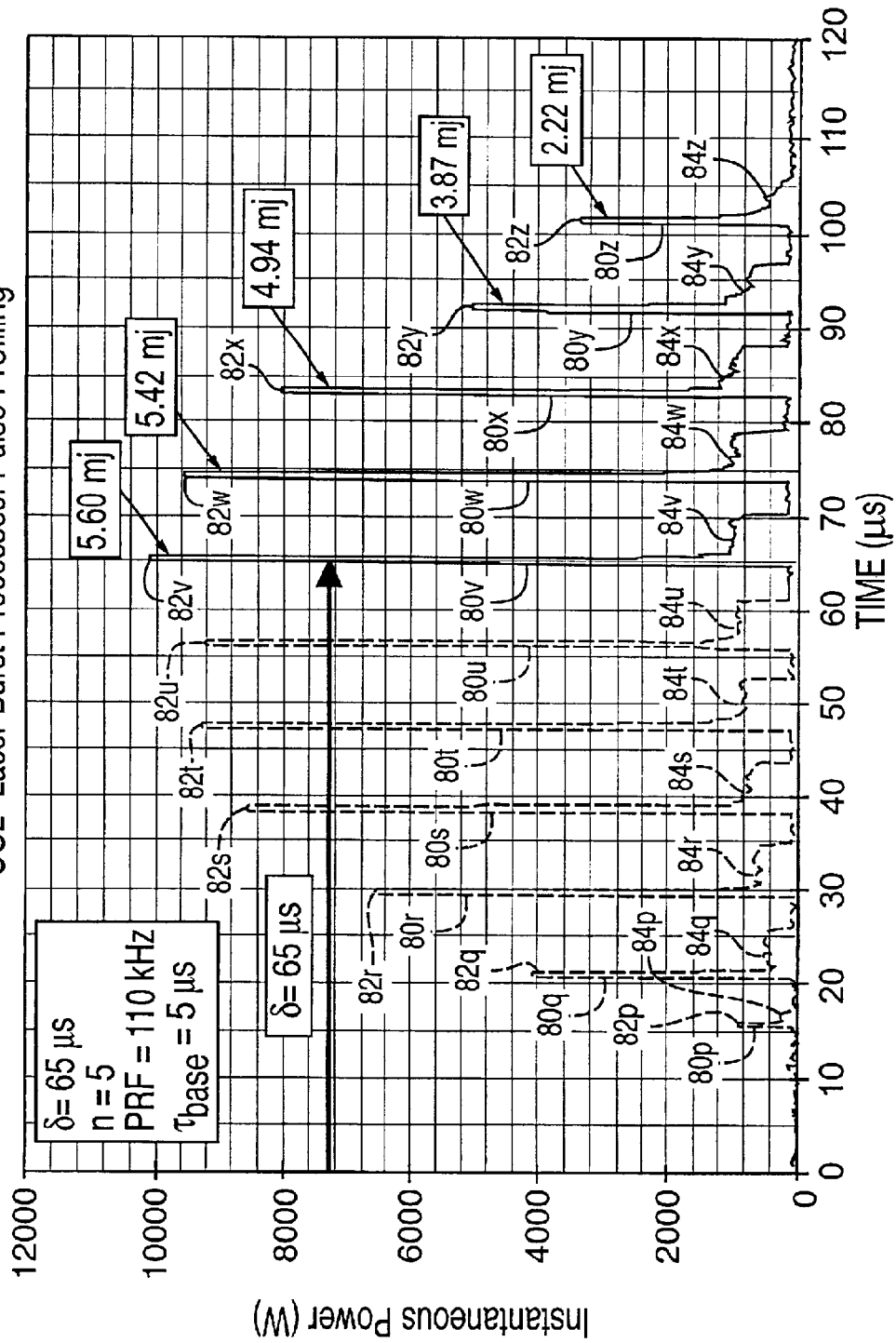
FIG. 9 is a graph of instantaneous power versus time for the laser output of FIG. 7, modified to emit successively decreasing pulse energies.

FIG. 9 shows an exemplary corresponding case of a burst of a five-pulse "descending" profile, containing only laser pulses 80v–80z of FIG. 7. The pulses 80p–80u are not generated, but are shown in phantom for convenience. The only parameter changed from those employed in the bursts of FIGS. 7 and 8 is the value chosen for the delay δ. For the burst shown in FIG. 9, the delay is 65 µs. A resulting descending profile such as that of the burst shown in FIG. 9 may be of particular interest in laser micromachining processes such as microvia drilling. The descending-pulsewidth profile may permit the laser to control the shape and taper of the via side walls. When used in combination with pulse-width control, the techniques of the present invention permit more flexible tuning of both the individual pulse waveforms (spike and tail regions) and the burst profile of pulse-by-pulse energy and peak power. These techniques permit the laser operator to optimize both material processing speed and quality, such as improved via-drilling throughput and improved side wall characteristics or reduced degree of taper.

Skilled persons will appreciate that there are many more possible ways to vary the pulse energy, the peak power, and the timing of the delivery of laser energy to the target areas 72 of workpiece 62 in addition to the various combinations of the parameters in FIG. 4. For example, the PRF does not have to be held constant and can be modified between or even during pumping spans, such as by ramping up or down, to effect changes in the amplitudes of peak instantaneous power in the gain spikes 82 and energies of the laser pulses 80. Similarly, the pulsewidth $\tau_{base}$ does not have to be held constant between or even during pumping spans and can also be used to effect changes in the peak instantaneous powers of gain spikes 82 and energies of the laser pulses 80. The fundamentals of the effects of varying these parameters on the gain cell output 17 provide a degree of control achievable and a tunability of the laser system output 18 heretofore unavailable for $CO_2$ and other gas lasers, as well as increased processing speeds.

In a further example of versatility, a single RF pumping span can be used to deliver two or more pulse bursts each having the same or different number of one or more laser pulses 80. One way that this technique can be accomplished is by keeping the EOM 36 closed for a long enough period after a pulse burst to recharge sufficiently for a subsequent burst within the same pumping span. The EOM 36 can be controlled to provide such pulse bursts having the same or different pulse burst periods, same or different pulse burst numbers, same or different pulse burst energies, and/or the same or different tail durations. The delay between the first and second pulse bursts can be adjusted to adjust the height of the peak instantaneous power of at least the first laser pulse 80 of each subsequent pulse burst. In addition, the PRFs of the laser pulses 80 in each of the pulse bursts can be the same or different.

One set of examples of how specific micromachining processes can be optimized for specific substrate materials through laser-tuning in accordance with the present invention is presented by way of example to microvia-drilling tests conducted by an SPL-100-HE laser employed in laser system 10 on FR4 workpieces 62. The FR4 used in the following examples had a construction designated 1×1080 and included a glass-cloth-reinforced epoxy resin layer nominally 63 µm thick sandwiched between copper layers 18 µm thick. The top copper layer had 150-µm openings pre-etched in it at each via target area 72. The optical system of laser system 10 was adjusted to produce a circular focused laser spot at the work surface about 250 µm in diameter, so that the 150-µm etched openings in the top copper layer would function as a conformal mask for the beam. Drilling was conducted in a typical fashion, with the laser system output 18 dwelling at each via target area 72 for a programmed number of laser pulses 80 or bursts and then moving to the next via target area 72. No intra-via beam motion (motion within the via), such as trepanning or spiralling, was included in the process. This stationary-beam approach is often referred to in the laser-micromachining literature as "percussion drilling" or "punching."

Testing was initiated with short, 0.5 µs laser pulses 80. This first pulsewidth $\tau_{base}$ was chosen to minimize the effect of the pulse tail 84 and deliver energy to the target material largely in the high-instantaneous-power regimes of the Q-switched spike 82. The goal was to address the disparity in vaporization temperature between the glass fibers and the epoxy resin by delivering the energy very rapidly to the target material. This rapid delivery of energy has the effect of driving the local temperature above the higher of the two vaporization points (several thousand Kelvin for glass) very rapidly. The desire was to vaporize both materials quickly and thereby obtain roughly equal amounts of material removal in the two materials despite the differences in their thermal characteristics. If, instead, the pulse energy was to be delivered at low instantaneous power levels, the epoxy could still have reached its vaporization temperature early in the laser pulse 80, while the glass remained solid and unablated. Delivery of such low instantaneous power levels leads to differential material-removal effects whereby the unvaporized ends of the glass fibers would protrude into the hole, because the more aggressive ablation of the epoxy enlarges the hole diameter relative to the area in which the glass is ablated. This phenomenon is known as "wicking" in the printed wiring board industry. In FR4 via drilling, wicking is more severe with lower-energy laser pulses 80.

In addition to the wicking problem, there is another problem when attempting to drill FR4 with low-energy and low-amplitude laser pulses 80. Even if the glass-fiber ends are ablated relatively flush with the epoxy via walls, if the pulse energy or amplitude or both are not sufficient, the glass is not cleanly vaporized. Instead, the ends melt, are not ejected from the hole, and re-solidify into large spherical knobs at the fiber ends. This is an unacceptable final geometry for the drilled holes.

In an early experiment with drilling 1×1080 FR4, laser system 10 employed parameters that included two bursts of five laser pulses 80, each having a pulsewidth $\tau_{base}$ of 0.5 μs, at a PRF of 60 kHz. The delay and burst repetition frequency were set at a level to produce a peak power amplitude of the gain spike 82 of the first laser pulse 80 of each burst.

After two five-pulse bursts, electron micrographs of the FR4 revealed vias with side walls that were very clean, with good taper, no protruding fiber ends, and no re-solidified glass knobs. However, the electron micrograph showed that in high-glass-density regions, not all of the glass had been removed from the bottoms of the vias. After three five-pulse bursts, electron micrographs revealed results that were substantially the same. When the burst number m was increased to four, electron micrographs revealed that the glass had been removed from all the holes. However, a cross-sectional view revealed that resin had begun to etch back from the rim of the opening in the top copper. This "etchback" is an unacceptable hole geometry. The transition between incomplete glass removal and onset of etchback when increasing the burst number m from three to four suggested that longer laser pulses 80 might present a larger processing window for FR4 target material. Although the ablation was very clean, with minimal difference in material-removal rates between the glass and the epoxy, an investigation into longer laser pulses 80 was undertaken, rather than running additional trials to further fine-tune a short-pulse process. Such refinements of short laser pulses 80 might include, but are not limited to, reducing the number of pulses to four and applying four bursts, increasing the number of pulses in each burst to six and applying three bursts, and/or changing the delay so that the results are better with three or four bursts, for example.

In an experiment employing longer laser pulses 80 for drilling 1×1080 FR4, laser system 10 employed parameters that included two bursts of five laser pulses 80, each having a pulsewidth $\tau_{base}$ of 5.0 μs, at a PRF of 100 kHz. The delay and burst-repetition frequency were set at a level to produce a peak power amplitude of the gain spike 82 of the first pulse 80 of each burst. After a single five-pulse burst, electron micrographs of the FR4 revealed via side walls that looked good but had glass remaining in the vias located in high-glass-density regions of the workpiece 62. After two bursts, electron micrographs revealed noticeable etchback in the resin near both the top and bottom copper. The results suggested that a larger processing window might be obtained with laser pulses 80 of an intermediate pulsewidth.

In experiments employing laser pulses 80 of intermediate pulsewidths of 1.8 μs and 3.2 μs, respectively, for drilling 1×1080 FR4, laser system 10 employed parameters that included two bursts of four laser pulses 80 at a PRF of 100 kHz. At these two pulsewidths, process conditions were found in which electron micrographs revealed good via-wall quality, no etchback, and complete removal of the glass from the via sites throughout the substrate. Electron micrographs after two bursts of 1.8-μs pulses revealed acceptable via-wall characteristics with large taper and some glass remaining in the holes in high-glass-density regions. However, electron micrographs after three bursts of 1.8-μs laser pulses 80 revealed acceptable via-drilling results, including removal of all glass in the high-glass-density regions, high- and low-glass-density regions having cleanly ablated ends of the glass fibers flush with the via walls, good via-wall characteristics, minimal knob formation on the fiber ends, minimal taper, and minimal etchback of the unreinforced resin (in low-glass-density areas) from the rim of the opening in the top copper layer. Electron micrographs after four bursts of 1.8-μs laser pulses 80 revealed significant etchback.

Electron micrographs after two bursts of 3.2-μs laser pulses 80 revealed acceptable via-drilling results, including removal of all glass in the high-glass-density regions, high- and low-glass-density regions having cleanly ablated ends of the glass fibers flush with the via walls, good via-wall characteristics, minimal knob formation on the fiber ends, minimal taper, and minimal etchback of the unreinforced resin (in low-glass-density areas) from the rim of the opening in the top copper layer. Electron micrographs after three bursts of 3.2-μs laser pulses 80 revealed significant etchback.

These exemplary experiments discussed above illustrate how the high pulse amplitude and energy afforded by the burst processing technique and the tunability of the laser system 10 in accordance with the present invention can be used to find a solution to the difficult problem of robustly drilling microvias in FR4 materials. Skilled persons will note that the only parameters varied to a significant extent in these experiments were the pulsewidth, $\tau_{base}$, and the number of bursts applied, m. These examples present, therefore, only a quick investigation to demonstrate that the gross characteristics of the laser output 18 are suitable for FR4 drilling applications. The other tunability parameters previously discussed can be adjusted to fine-tune results to accommodate specific materials or variations within particular materials.

In addition, the tunability of the laser system 10 of the present invention can be used to machine through the top metal layer of the vias, so the targets do not have to be pre-etched. In another exemplary experiment, with parameters $\tau_{base}$=10 μs, n=1, m=1, and a burst energy (and pulse energy since n=1) of 13.971 mJ with the delay adjusted to optimize the peak power amplitude of gain spike 82, laser system 10 was able to cut small-diameter holes (about 80-μm diameter) through a thin layer of copper (having a black oxide treatment). Similarly, with parameters $\tau_{base}$= 14.2 μs, n=1, m=1, and a burst energy (and pulse energy since n=1) of 16.227 mJ with the delay adjusted to optimize the peak power amplitude of gain spike 82, laser system 10 was able to cut small-diameter holes through thin-layer copper. In another exemplary experiment, with parameters $\tau_{base}$=5.0 μs, n=2, m=1, and PRF=100 kHz, laser system 10 was able to cut better and more consistent holes through copper layers when delays of 45 μs, 65 μs, and 85 μs with respective burst energies of 14.081 mJ, 15.402 mJ, and 13.971 mJ were employed.

Several via-drilling strategies for throughput enhancement can be presented in light of these few exemplary experiments and the other tunabilty aspects previously discussed. For example, for drilling blind vias where the top metal layer has been pre-etched, 1–3 bursts of 2–11 laser pulses 80 could be employed for removing the nonmetallic interlayer. The later bursts or pulses can be tailored to have energies below the damage threshold of the bottom metallic layer. For example, the first burst might contain pulse profiles that include fewer laser pulses 80 of the highest-amplitude gain spikes 82 while the second burst might contain a large number of laser pulses 80 in which the gain spikes 82 are primarily sequentially descending, such that the energy density of the laser pulses 80 decreases as the drilling process approaches the bottom metal layer of the via. For certain material processing applications, it may be desirable to apply only the gain spikes 82 of laser pulses 80 by using the EOM 36 to cut off the tails 84, for example, at the beginning or end of a multiple burst process and to apply laser pulses 80 with both spikes 82 and tails 84 during different phases of the machining process, and perhaps even minimizing the peak instantaneous power of the spikes 82 of the latter laser pulses 80.

In another example, for drilling blind vias where the top metal layer has not been pre-etched, 1–3 bursts of 1–3 laser pulses 80 could be employed to provide energy densities above the metal-ablation threshold to remove the top metallic layer, and the nonmetallic interlayer can be processed as described above. Hence, one, several, or all of the tunabilty parameters can be changed between each burst. For example, one or more bursts having laser pulses 80 of a long tail duration generated at a high repetition rate may be employed to process the top metallic material and one or more bursts having laser pulses 80 of a shorter tail duration at a lower repetition rate may be employed to process the underlying nonmetallic material. Additionally or alternatively, the shorter tail duration pulses 80 may be shortened to the extent that they primarily contain spike energy. For example, such pulses may be delivered at a repetition rate of greater than 100 kHz and delivered in bursts of 15 or even 25 or greater pulses. Additionally or alternatively, the metal-processing bursts may contain fewer laser pulses 80 than the nonmetal-processing bursts, and the burst may contain the same or different amounts of energy. Additionally or alternatively, the delay in the nonmetal-processing burst may be shorter than that in the metal-processing burst. Additionally or alternatively, the nonmetal-processing burst may have a duty cycle that is higher than that of metal-processing burst.

With respect to through-hole via drilling, burst and pulse profiles that maximize throughput through the metal layers may be employed for all layers, so long as the via quality through the nonmetallic interlayer is acceptable. Because the burst durations are long compared to the pulsewidths and because superpumping the gain cell 16 during the RF pumping spans may impact the frequency of bursts, for throughput considerations it is desirable to minimize the number of bursts used to process each via. For example, for most applications, it would be preferable to employ fewer bursts of more laser pulses 80 rather than more bursts of fewer laser pulses 80. Thus application of slightly longer but lower superpumping power RF in bursts delivered at a higher duty cycle and containing more laser pulses 80 may be employed to minimize the number of bursts to accomplish a laser machining operation. In addition or in the alternative, the higher superpumping power could be maintained and the RF OFF span could be decreased during laser operations employing multiple RF bursts over a single target area 72 and then the RF OFF span could be increased during target-to-target move times. Skilled persons will also appreciate that to eliminate extra set(s) of hole-to-hole move times, it is preferred to employ a single-pass process in which one via target area 72 is completely processed, even when parameter changes between bursts are desired, before directing the laser output 18 to a second target area 72.

Skilled persons will appreciate, however, that for all multimaterial processes, two or more passes could be employed wherein all the via target areas 72 are processed at a single set of parameters and then the parameters are adjusted and all the via target areas 72 are processed at the subsequent set of parameters.

In yet another example of versatility, the laser system 10 can be operated in a nonsuperpumping CW mode in which the duty cycle is 100% as well as in the RF burstpumped, superpumping mode. Both modes can be applied to the same target area 72. In some instances, laser pulses 80 produced by a superpuming mode can be applied to one material, such as copper, and then the laser system 10 can be run in CW mode to apply CW-EOM-switched laser pulses of an unlimited number to another material, such as dielectric. Alternatively, some target areas 72 could be processed in the superpumping mode and other target areas 72 on the same workpiece could be processed by in the CW mode. For example, the superpumping mode could be employed to process reinforced resins and the CW mode could be employed to process unreinforced resins or larger diameter vias where nonpunching operations, such as spiraling may be preferred. Alternatively, the superpumping mode could be employed for some operations, such as via drilling, and the CW mode could be employed for other operations such as cleaning or cutting.

The top and/or bottom metal layers can alternatively be drilled with a second laser or laser head such as a diode-pumped solid-state UV YAG laser. The two different laser systems could be adapted to form part of a cluster tool. An exemplary implementation of multiple laser heads in a positioning system is described in detail in U.S. Pat. No. 5,847,960 of Cutler et al. Exemplary diode-pumped solid-state UV YAG lasers are described in detail in U.S. Pat. Nos. 5,593,606 and 5,841,099 of Owen et al., in U.S. patent appl. Ser. No. 09/580,396 of Dunsky et al. and the corresponding International Publication No. WO 00/73013, and in U.S. patent appl. Ser. No. 09/823,922 of Dunsky et al. and the corresponding International Publication No. WO 00/74529 and U.S. Pat. Pub. No. US-2001-0045419-A1.

Skilled persons will appreciate that trepanning during bursts could be employed but is not presently preferred. However, overlap punching with laser system 10 can be employed to cut lines in green ceramic tape. Skilled person will also appreciate that although the description is largely directed toward processing unclad or copper clad reinforced resin or reinforced organic dielectric materials, the laser tunability techniques described herein can used to machine unreinforced materials as well as other difficult to process materials.

It will be obvious to those having skill in the art that many changes may be made to the details of the above-described embodiments of this invention without departing from the underlying principles thereof. For, example, the bursts and/or laser pulses 80 can be shaped by controlling any combination of one of more of the following parameters: the RF pumping duty cycle, the delay between the onset of RF pumping and the initiation of Qswitching, the pulse repetition frequency, and/or the duration of the tail. The scope of the present invention should, therefore, be determined only by the following claims.

What is claimed is:

1. In a $CO_2$ laser system having a resonator cavity that includes a gas gain medium that in response to pumping energy supplied by a pumping source produces stimulated emission energy, a method for laser micromachining, comprising:

supplying pumping energy, from the pumping source at a pumping start time and throughout a pumping span, to the gas gain medium within the resonator cavity;

generating from the resonator cavity a laser output of a burst of at least one laser pulse, including a first laser pulse, of stimulated emission energy from the resonator cavity during the pumping span, wherein the resonator cavity includes Q-switch that in response to an applied switching signal causes at least first and second states corresponding to respective low and high values of optical gain in the resonator cavity and influences multiple waveform characteristics of each laser pulse, wherein changing the applied switching signal from the first state to the second state at a pulse extraction start time causes extraction of each laser pulse and changing the applied signal from the second state to the first state at a pulse termination time causes termination of each laser pulse, wherein each laser pulse has a pulsewidth that includes a time interval between the pulse extraction time and the pulse termination time, wherein each laser pulse is characterized by a spike having a peak instantaneous power followed by a tail having a range of tail instantaneous powers above a nonzero value, wherein the spike has a spike duration and the tail has a tail duration that is substantially greater than the spike duration, and wherein a delay is introduced between the pumping start time and the pulse extraction time of the first laser pulse to influence the peak instantaneous power of the spike of at least the first laser pulse; and directing the burst of the laser output to remove target material at a target area.

2. The method of claim 1, in which the delay is selected to cause the first laser pulse to have a highest peak instantaneous power available over the pumping span.

3. The method claim 1, further comprising adjusting the pulse termination time of changing the applied signal from the first state to the second state to control the tail duration and/or pulsewidth.

4. The method of claim 1 in which the burst of laser output contains at least two laser pulses.

5. The method of claim 4, further comprising selecting the amount of the delay to produce a burst of laser pulses having a predetermined profile of peak instantaneous powers.

6. The method of claim 5 in which the profile comprises sequentially increasing peak instantaneous powers.

7. The method of claim 5 in which the profile comprises sequentially decreasing peak instantaneous powers.

8. The method of claim 1, in which the Q-switch includes an electro-optic modulator.

9. The method of claim 4, in which the laser pulses are generated at a pulse repetition frequency of between about 20 to about 300 kHz.

10. The method of claim 4, in which the laser pulses are generated at a pulse repetition frequency of greater than 30 kHz.

11. The method of claim 1, in which each laser pulse has a spike duration of about 80 to about 150 nanoseconds and a tail duration of about 0.05 to about 15 microseconds.

12. The method of claim 4 in which at least one spike comprises a peak instantaneous power of greater than 25 kW and in which at least one tail comprises a local range of tail instantaneous powers of greater than 0.5 kW.

13. The method of claim 1 in which at least one spike comprises a peak instantaneous power of greater than 35 kW and in which at least one tail comprises a local range of tail instantaneous powers of greater than 1 kW.

14. The method of claim 1 in which the tail comprises more energy than that of the spike.

15. The method of claim 1 in which supplying pumping energy comprises providing RF pumping energy during the pumping span.

16. The method of claim 15 in which the RF pumping energy comprises a pumping power that is greater than or equal to about 4 kW.

17. The method of claim 16 in which the RF pumping energy comprises a pumping power that is greater than or equal to about 8 kW.

18. The method of claim 1 in which the pumping span has a duration of about 50 to 250 microseconds.

19. The method of claim 1 in which the pumping span and a nonpumping interval form a pumping cycle that has a duration of about 0.5 to about 2 milliseconds.

20. The method of claim 19 in which the duration of the pumping span divided by the duration of the pump cycle constitutes a duty cycle that is less than or equal to about 25%.

21. The method of claim 20 in which the duration of the pumping span divided by the duration of the pump cycle constitutes a duty cycle that is less than or equal to about 12.5%.

22. The method of claim 1, further comprising:
supplying pumping energy to the gas gain medium during at least two non-overlapping pumping spans, wherein each of the pumping spans supports respective laser outputs, each laser output comprising a burst of at least two laser pulses.

23. The method of claim 22 in which at least two of the bursts are directed at a single target area to form a via.

24. The method of claim 1 in which the gas gain medium is employed in a waveguide channel positioned within the resonator cavity between the Q-switch and an output coupler along an optical path and in which the Q-switch comprises an electro-optical modulator.

25. The method of claim 24 in which the wavegiude channel includes at least one fold with a fold mirror positioned along the optical path.

26. The method of claim 25 in which the waveguide channel is sealed and contains the gas gain medium.

27. The method of claim 1 in which the each laser pulse is highly focusable.

28. The method of claim 4 in which the laser pulses comprise a wavelength between about 9 and 11 microns.

29. The method of claim 4 in which the laser pulses form a via in a heterogenous target material including at least a first material having a relatively lower vaporization temperature and a second material having a relatively higher vaporization temperature.

30. The method of claim 29 in which the first material comprises an organic resin and the second material comprises silicon dioxide.

31. The method of claim 30 in which the target comprises FR4, FR5, or chopped glass reinforced epoxy resin.

32. The method of claim 29 in which the first material comprises an organic binder and the second material comprises ceramic micro-particles.

33. The method of claim 32 in which the target comprises green ceramic.

34. The method of claim 22 in which the at least two of the bursts have an equal number of pulses and similar instaneous power profiles.

35. The method of claim 22 in which the at least two of the bursts have an equal number of pulses and substantially different instaneous power profiles.

36. The method of claim 22 in which at least one of the bursts of laser pulses comprises first, second, and third sequential pulses having spikes of respective first, second, and third peak instantaneous powers wherein the second peak instantaneous power is greater than are either of the first and third peak instantaneous powers.

37. The method of claim 1 in which the laser pulses are employed to remove a dielectric layer and in which solid-state UV laser outputs are employed to remove a metal layer overlying the dielectric layer.

38. The method of claim 22 in which the laser pulses of at least two of the bursts are generated at different pulse repetition frequencies.

39. The method of claim 22 in which at least two of the bursts comprise a different number of laser pulses.

40. The method of claim 22 in which at least two of the bursts comprise first laser pulses having different peak instantaneous powers.

41. The method of claim 22 in which at least two of the bursts comprise first laser pulses having about the same peak instantaneous powers.

42. The method of claim 22, further comprising selecting the amount of the delay within at least one pumping span to produce at least one burst of laser pulses having a gain curve profile of increasing peak instantaneous powers.

43. The method of claim 22, further comprising selecting the amount of the delay within at least one pumping span to produce at least one burst of laser pulses having a gain curve profile of decreasing peak instantaneous powers.

44. The method of claim 22, further comprising selecting different amounts of the delay within at least two pumping spans to produce at least two bursts of laser pulses having a gain curve profiles of decreasing peak instantaneous powers and increasing peak instantaneous powers, respectively.

45. The method of claim 22, further comprising selecting the amount of the delay within each pumping span to produce each burst of laser pulses to have substantially similar gain curve profiles of peak instantaneous powers.

46. The method of claim 22, in which at least two of the pumping spans have different durations.

47. The method of claim 22, in which each of the pumping spans have substantially similar durations.

48. The method of claim 22, in which at least two of the pumping spans are pumped at different power levels.

49. The method of claim 22, in which each of the pumping spans are pumped at substantially similar power levels.

50. The method of claim 22, in which at least two of the bursts result from supplying energy to the gas gain medium at different duty cycles.

51. The method of claim 22, in which each of the bursts result from supplying energy to the gas gain medium at substantially similar duty cycles.

52. The method of claim 22, in which at least two of the laser pulses within at least one burst have tails of different tail durations.

53. The method of claim 22, in which each of the laser pulses within at least one burst have tails of substantially similar tail durations.

54. The method of claim 22, in which at least two of the laser pulses within each burst have tails of similar tail durations.

55. The method of claim 22, in which each of the laser pulses within a first burst have tails of substantially similar tail durations and in which each of the laser pulses within a second burst have tails of substantially similar tail durations that are different from those of the laser pulses in the first burst.

56. The method of claim 22 in which the bursts of laser output are delivered at a burst repetition rate of greater than 1 kHz.

57. The method of claim 1 in which the resonator cavity has thermal load design limit that limits a maximum amount of CW pumping energy per time that can be supplied to the gain medium at a duty cycle of 100% over a pump cycle period, such that the pump cycle period minus the pumping span equals a zero value, without adversely affecting the resonator cavity and/or the energy dynamics of the gain medium, further comprising:
  reducing the duty cycle over the pump cycle period, such that the pump cycle period minus the pumping span is a non zero value; and
  supplying a greater amount of pumping energy per time than the maximum amount of CW pumping energy per time.

58. The method of claim 40 in which at least two of the burst having first laser pulses of different peak instantaneous powers also have delays of different amounts of time.

59. The method of claim 40 in which at least two of the bursts having first laser pulses of different peak instantaneous powers also have pumping energies supplied at different rates.

60. The method of claim 3 in which adjusting the pulse termination time controls an amount of energy delivered by the laser pulse.

61. The method of claim 16 in which the pumping energy is supplied at a duty cycle of less than or equal to about 25%.

62. The method of claim 17 in which the pumping energy is supplied at a duty cycle of less than or equal to about 12.5%.

63. The method of claim 24 in which the laser pulse has a high mode quality.

64. The method of claim 22 in which a first burst has at least two longer laser pulses of a long tail duration generated at a high repetition rate and in which a second burst has at least two shorter laser pulses of a short tail duration that is shorter than the long tail duration, the shorter laser pulses being generated at a lower repetition rate than the high repetition rate.

65. The method of claim 64 in which the delay in the second burst is shorter than that in the first burst.

66. The method of claim 64 in which the second burst has a duty cycle that is higher than that of the first burst.

67. The method of claim 64 in which the first burst is directed at a material that is highly reflective to IR laser radiation.

68. The method of claim 64 in which the first burst is directed at a metallic material and the second burst is directed at a dielectric material.

69. The method of claim 7 in which the burst is directed at a dielectric material supported on and in proximity to a metallic material.

70. The method of claim 1 in which at least one laser pulse having a tail duration of at least 3 microseconds are applied to a metallic material.

71. The method of claim 22 in which at least two laser pulses having tail durations of at least 3 microseconds are applied to a metallic material.

72. The method of claim 22 in which the laser pulses of at least two bursts form a via in a heterogenous target material including at least a first material having a relatively lower vaporization temperature and a second material having a relatively higher vaporization temperature.

73. The method of claim 72 in which the first material comprises an organic resin and the second material comprises silicon dioxide.

74. The method of claim 73 in which the target comprises FR4.

75. The method of claim 72 in which the first material comprises an organic binder and the second material comprises ceramic micro-particles.

76. The method of claim 75 in which the target comprises green ceramic.

77. The method of claim 64 in which the first burst has fewer pulses than the second burst.

78. The method of claim 77 in which the first burst and the second burst deliver similar amounts of energy to the target area.

79. The method of claim 64 in which the first burst and the second burst deliver similar amounts of energy to the target area.

80. The method of claim 77 in which the second burst has at least 10 laser pulses.

81. The method of claim 77 in which the spikes of the first burst similar peak instantaneous powers.

82. The method of claim 4 in which the spikes of the laser pulses have similar peak instantaneous powers.

83. The method of claim 48, in which multiple target areas are processed with respective bursts of a first power level and then the multiple target areas are processed with respective bursts of a second power level different from the first power level.

84. The method of claim 22 in which a first laser output is directed at a metallic material and a second laser output is directed at a nonmetallic material.

85. The method of claim 1 in which the laser output comprises at least two bursts each having at least two laser outputs separated by a pulse delay during a single pumping span.

86. The method of claim 1 in which the laser output comprises at least first and second sequential bursts each having at least two laser outputs separated by an intervening delay during a single pumping span, wherein the amount of delay impacts the amplitude of the peak instantaneous power of the first laser pulse of the first burst and the amount of the intervening delay impacts the amplitude of the of the first laser pulse of the second burst.

87. The method of claim 86 in which the delay and intervening delay are different amounts of time.

88. The method of claim 86 in which the laser pulses of first and second bursts are delivered at different PRFs.

89. The method of claim 22 in which the laser outputs each comprise at least first and second sequential bursts each having at least two laser outputs separated by an intervening delay during a single pumping span, wherein the amount of delay impacts the amplitude of the peak instantaneous power of the first laser pulse of the first burst and the amount of the intervening delay impacts the amplitude of the of the first laser pulse of the second burst.

90. The method of claim 89 in which the delay and intervening delay are different amounts of time.

91. The method of claim 89 in which the laser pulses of first and second bursts are delivered at different PRFs.

92. The method of claim 1 in which the laser system is employed in a CW mode having a 100% cycle to process the target area.

93. The method of claim 22 in which the laser system is employed in a CW mode having a 100% cycle to process the target area.

94. The method of claim 4 in which the laser system is employed in a CW mode having a 100% cycle to process the target area.

95. The method of claim 1 in which at least one of or any combination of an RF pumping duty cycle, an RF pumping level, the delay, a pulse repetition frequency, the tail duration, a number of bursts within the laser output, a number of pulses within a burst, and/or number of bursts directed at a single target is adjustable to facilitate processing of a specific target material.

96. The method of claim 22 in which at least one of or any combination of an RF pumping duty cycle, an RF pumping level, the delay, a pulse repetition frequency, the tail duration, a number of bursts within the laser output, a number of pulses within a burst, and/or number of bursts directed at a single target is adjustable to facilitate processing of a specific target material.

97. In a $CO_2$ laser system having a resonator cavity that includes a gas gain medium that in response to pumping energy supplied by a pumping source produces stimulated emission energy, a method for laser micromachining, comprising:

supplying pumping energy, from the pumping source at a pumping start time and throughout a pumping span, to the gas gain medium within the resonator cavity;

generating from the resonator cavity a laser output of a burst of at least two laser pulses, including a first laser pulse, of stimulated emission energy from the resonator cavity at a pulse repetition frequency that is greater than 10 kHz during the pumping span, wherein the resonator cavity includes an electro-optical modulator that in response to an applied switching signal causes at least first and second states corresponding to respective low and high values of optical gain in the resonator cavity and influences multiple waveform characteristics of each laser pulse, wherein changing the applied switching signal from the first state to the second state at a pulse extraction start time causes extraction of each laser pulse and changing the applied signal from the second state to the first state at a pulse termination time causes termination of each laser pulse, wherein each laser pulse has a pulsewidth that includes a time interval between the pulse extraction time and the pulse termination time, wherein each laser pulse is characterized by a spike having a peak instantaneous power followed by a tail having a range of tail instantaneous powers above a nonzero value, and wherein the spike has a spike duration and the tail has a tail duration that is substantially greater than the spike duration, whereby selecting the tail duration time by changing the applied signal from the second state to the first state determines the energy delivered by the laser pulses; and directing the burst of the laser pulses to remove target material at a target area.

98. In a $CO_2$ laser system having a resonator cavity that includes a gas gain medium that in response to pumping energy supplied by a pumping source produces stimulated emission energy, a method for laser micromachining, comprising:

supplying pumping energy, from the pumping source at a pumping start time and throughout a pumping span, to the gas gain medium within the resonator cavity;

generating from the resonator cavity a laser output of a burst of at least two laser pulses, including a first laser pulse, of stimulated emission energy from the resonator cavity at a pulse repetition frequency that is greater than 10 kHz during the pumping span, wherein the resonator cavity includes an electro-optical modulator that in response to an applied switching signal causes at least first and second states corresponding to respective low and high values of optical gain in the resonator cavity and influences multiple waveform characteristics of each laser pulse, wherein changing the applied switching signal from the first state to the second state at a pulse extraction start time causes extraction of each laser pulse and changing the applied signal from the second state to the first state at a pulse termination time causes termination of each laser pulse, wherein each laser pulse is characterized by a spike having a peak instantaneous power, wherein an amount of delay is introduced between the pumping start time and the pulse extraction time of the first laser pulse, and wherein the peak instantaneous power of the spike of at least the first laser pulse has a level that is impacted by the amount of the delay; and directing the burst of the laser pulses to remove target material at a target area.

99. The method of claim 98 wherein the laser pulses are each characterized by a tail having a tail duration following the spike having a spike duration, the tail having a range of tail instantaneous powers above a nonzero value and the tail duration being substantially greater than the spike duration.

100. The method of claim 98 in which at least 20 laser pulses are generated during the pumping span at a PRF of greater than about 100 kHz.

101. In a $CO_2$ laser in which a resonator cavity characterized by an optical gain includes a gas gain medium and a Q-switch, the gas gain medium in response to pumping energy supplied by a pumping source producing stimulated emission energy, and the Q-switch in response to an applied switching signal controlling the optical gain of the resonator cavity and thereby controlling extraction of a pulse of stimulated emission energy from the resonator cavity, the pulse of the stimulated emission energy having multiple waveform characteristics, a method of controlling one or more of the waveform characteristics, comprising:

applying in sequence the pumping energy to produce stimulated emission energy and the switching signal to extract a pulse of the stimulated emission energy, the application of the pumping energy corresponding to a pumping start time and the application of the switching signal corresponding to a pulse extraction start time; and introducing between the pumping start time and the pulse extraction start time a delay of an amount that causes production of stimulated emission energy in the gas gain medium to a level that causes, upon occurrence of the pulse extraction start time, extraction of the pulse of stimulated emission energy characterized by an increase to a maximum peak power amplitude and a subsequent decrease to a range of local maximum tail power amplitudes of nonzero values, each of the maximum peak and the range of local maximum tail power amplitudes having a duration, and the duration of the maximum peak power amplitude being substantially less than the duration of the range of local maximum tail power amplitudes.

102. The method of claim 101, in which an amount of the delay that is shorter or longer than a nominal amount causes extraction of a pulse of stimulated emission energy of a, respectively, lesser or greater maximum peak power amplitude than a maximum peak power amplitude caused by the nominal amount of the delay.

103. The method of claim 91, in which changing the delay by a shorter or longer amount causes extraction of a pulse of stimulated emission energy of a, respectively, lesser or greater maximum peak power amplitude.

104. The method claim 91, in which the switching signal changes from a first state to a second state that correspond to, respectively, a low value and a high value of the optical gain of the resonator cavity and in which a transition between the first and second states corresponds to an occurrence of the pulse extraction start time, further comprising controlling the duration of the range of local maximum tail power amplitudes by controlling a duration of the switching signal in the second state.

105. The method of claim 91, in which the Q-switch includes an electro-optic modulator.

106. The method of claim 91, in which the pumping start time initiates a pumping span and in which the applying in sequence the pumping energy and the switching signal extracts a first pulse of the stimulated emission energy, and further comprising applying one or more subsequent switching signals to extract a subsequent pulse of stimulated emission energy corresponding to each subsequent switching signal applied during the pumping span.

107. The method of claim 96, in which each subsequent pulse of stimulated emission energy is characterized by an increase to a maximum peak power amplitude, and further comprising selecting the amount of the delay to produce a profile of maximum peak amplitudes of the first and subsequent pulses of stimulated emission energy.

108. The method of claim 97, in which selecting the delay to be a shorter or longer amount causes extraction of the first pulse of stimulated emission energy of a, respectively, lesser or greater maximum peak power amplitude.

109. The method of claim 96, in which an amount of the delay that is shorter than a nominal amount causes extraction of the first and one of subsequent pulses of stimulated emission energy of, respectively, a lesser maximum pulse energy than a maximum pulse energy caused by the nominal amount of the delay and a greater maximum pulse energy than the lesser maximum pulse energy of the first pulse of stimulated emission energy.

110. The method of claim 6, in which the amount of the delay that is longer than a nominal amount causes extraction of the first and one of subsequent pulses of stimulated emission energy of, respectively, a greater maximum pulse energy than a maximum pulse energy caused by the nominal amount of the delay and a lesser maximum pulse energy than the greater maximum pulse energy of the first pulse of stimulated emission energy.

* * * * *

UNITED STATES PATENT AND TRADEMARK OFFICE
CERTIFICATE OF CORRECTION

PATENT NO. : 6,784,399 B2
DATED : August 31, 2004
INVENTOR(S) : Dunsky et al.

It is certified that error appears in the above-identified patent and that said Letters Patent is hereby corrected as shown below:

Column 1,
Line 57, insert space after "micron-".

Column 8,
Line 15, delete comma after "based".
Line 66, insert -- laser -- in front of "pulse 80".

Column 11,
Line 6, change "allowed" to -- allow --.

Column 12,
Line 4, change "instanteous" to -- instantaneous --.
Line 12, change "nomimal" to -- nominal --.

Column 14,
Line 9, change "shotening" to -- shortening --.

Column 20,
Line 7, change "burstpumped" to -- burst-pumped --.
Line 10, change "superpuming" to -- superpumping --.
Line 46, insert -- be -- in front of "used".
Line 56, change "Qswitching" to -- Q-switching --.

Column 22,
Line 33, change "wavegiude" to -- waveguide --.
Lines 57 and 60, change "the at least two" to -- at least two --.
Lines 58 and 61, change "instaneous" th -- instantaneous --.

Column 23,
Lines 26-27, change "a gain curve profiles" to -- gain curve profiles --.
Line 66, insert -- a -- in front of "thermal load design".

Column 24,
Line 13, change "burst" to -- bursts --.
Line 50, change "are" to -- is --.

UNITED STATES PATENT AND TRADEMARK OFFICE
CERTIFICATE OF CORRECTION

PATENT NO. : 6,784,399 B2
DATED : August 31, 2004
INVENTOR(S) : Dunsky et al.

It is certified that error appears in the above-identified patent and that said Letters Patent is hereby corrected as shown below:

Column 25,
Lines 35 and 47, change "of the of the" to -- of the --.

Column 28,
Line 20, change "the applying in sequence the pumping energy" to -- applying in sequence the pumping energy --.

Signed and Sealed this

Eleventh Day of October, 2005

JON W. DUDAS
*Director of the United States Patent and Trademark Office*